United States Patent [19]
Gotou

[11] Patent Number: 6,067,253
[45] Date of Patent: *May 23, 2000

[54] NONVOLATILE SEMICONDUCTOR MEMORY DEVICE CAPABLE OF SUPPRESSING A VARIATION OF THE BIT LINE POTENTIAL

[75] Inventor: Hiroshi Gotou, Tokyo, Japan

[73] Assignee: NKK Corporation, Tokyo, Japan

[*] Notice: This patent is subject to a terminal disclaimer.

[21] Appl. No.: 08/765,589

[22] PCT Filed: May 30, 1996

[86] PCT No.: PCT/JP96/01457

§ 371 Date: Dec. 17, 1996

§ 102(e) Date: Dec. 17, 1996

[30] Foreign Application Priority Data

May 30, 1995 [JP] Japan ................................. 7-132127

[51] Int. Cl.$^7$ .................................................. G11C 16/06
[52] U.S. Cl. .............................. 365/185.25; 365/185.23; 365/185.08
[58] Field of Search ................... 365/185.23, 185.25, 365/185.08

[56] References Cited

U.S. PATENT DOCUMENTS

| | | | |
|---|---|---|---|
| 4,282,446 | 8/1981 | McElroy | 365/185.28 |
| 4,432,072 | 2/1984 | Chao et al. | 365/185.08 |
| 4,574,273 | 3/1986 | Atsumi et al. | 327/543 |
| 4,649,520 | 3/1987 | Eitan | 365/185.1 |
| 4,797,856 | 1/1989 | Lee et al. | 365/185.3 |
| 4,811,292 | 3/1989 | Watanabe | 365/185.23 |
| 4,931,997 | 6/1990 | Mitsuishi et al. | 365/185.04 |
| 4,953,123 | 8/1990 | Takeuchi et al. | 365/66 |
| 4,953,129 | 8/1990 | Kobayashi et al. | 365/185.25 |
| 4,958,317 | 9/1990 | Terada et al. | 365/185.02 |
| 5,068,827 | 11/1991 | Yamada et al. | 365/185.19 |
| 5,075,888 | 12/1991 | Yamauchi et al. | 365/185.08 |
| 5,105,384 | 4/1992 | Noguchi et al. | 365/185.23 |
| 5,126,808 | 6/1992 | Montalvo et al. | 365/185.09 |
| 5,126,969 | 6/1992 | Kawana | 365/185.08 |

(List continued on next page.)

FOREIGN PATENT DOCUMENTS

| | | | |
|---|---|---|---|
| 0108681 A3 | 5/1984 | European Pat. Off. | G11C 17/00 |
| 53-46621 | 12/1978 | Japan | G11C 11/40 |
| 62-266793 | 11/1987 | Japan | G11C 11/34 |
| 63-251999 | 10/1988 | Japan | G11C 17/00 |
| 2-166764 | 6/1990 | Japan | G11C 11/401 |
| 2-206093 | 8/1990 | Japan | G11C 16/06 |
| 4-105368 | 4/1992 | Japan | G11C 16/02 |
| 4-155694 | 5/1992 | Japan | G11C 16/06 |
| 5-189988 | 7/1993 | Japan | G11C 17/00 |
| WO 94/27295 | 11/1994 | WIPO | G11C 16/06 |

OTHER PUBLICATIONS

IEEE Journal of Solid–State Circuits, vol. 29, No. 2, Feb. 1994, pp. 147–150, M. Lanzoni et al, "A Novel approach to controlled programming of tunnel–based floating–gate MOSFET's".

IEEE Electron Device Letters, vol. 16, No. 3, Mar., 1995, "New Operation Mode for Stacked–Gate Flash Memory Cell," Hiroshi Gotou, pp. 121–123.

International Electron Devices Meeting. Dec. 8, 1980, Washington, D.C., USA, pp. 602–606, Kupec Et Al, "Triple Level Polysilicon E2PROM with Single Transistor Per Bit".

*Primary Examiner*—Viet Q. Nguyen
*Assistant Examiner*—Andrew Q. Tran
*Attorney, Agent, or Firm*—Frishauf, Holtz, Goodman, Langer & Chick

[57] ABSTRACT

The drain of memory cell transistor Ma1 is connected to sub-bit line BLsa1 of an EEPROM. The sub-bit line is connected to flip-flop circuit (SRAM bit cell) 30a through connection transistor Tpg. The sub-bit line potential corresponding to data to be written in memory cell transistor Ma1 is temporarily stored in flip-flop circuit 30a. This potential storage operation corresponds to a write operation in the SRAM cell and is therefore performed at a high speed. The potential of the sub-bit line is held at a predetermined value corresponding to the data temporarily stored in the SRAM cell.

8 Claims, 20 Drawing Sheets

U.S. PATENT DOCUMENTS

| | | | |
|---|---|---|---|
| 5,132,935 | 7/1992 | Ashmore, Jr. | 365/185.19 |
| 5,179,536 | 1/1993 | Kasa et al. | 365/200 |
| 5,278,794 | 1/1994 | Tanaka et al. | 365/185.17 |
| 5,282,161 | 1/1994 | Villa | 365/185.1 |
| 5,283,758 | 2/1994 | Nakayama et al. | 365/185.13 |
| 5,327,385 | 7/1994 | Oyama | 365/185.24 |
| 5,402,373 | 3/1995 | Aritome et al. | 365/185.14 |
| 5,406,521 | 4/1995 | Hara | 365/185.25 |
| 5,491,656 | 2/1996 | Sawada | 365/185.29 |
| 5,615,146 | 3/1997 | Gotou | 365/185.01 |

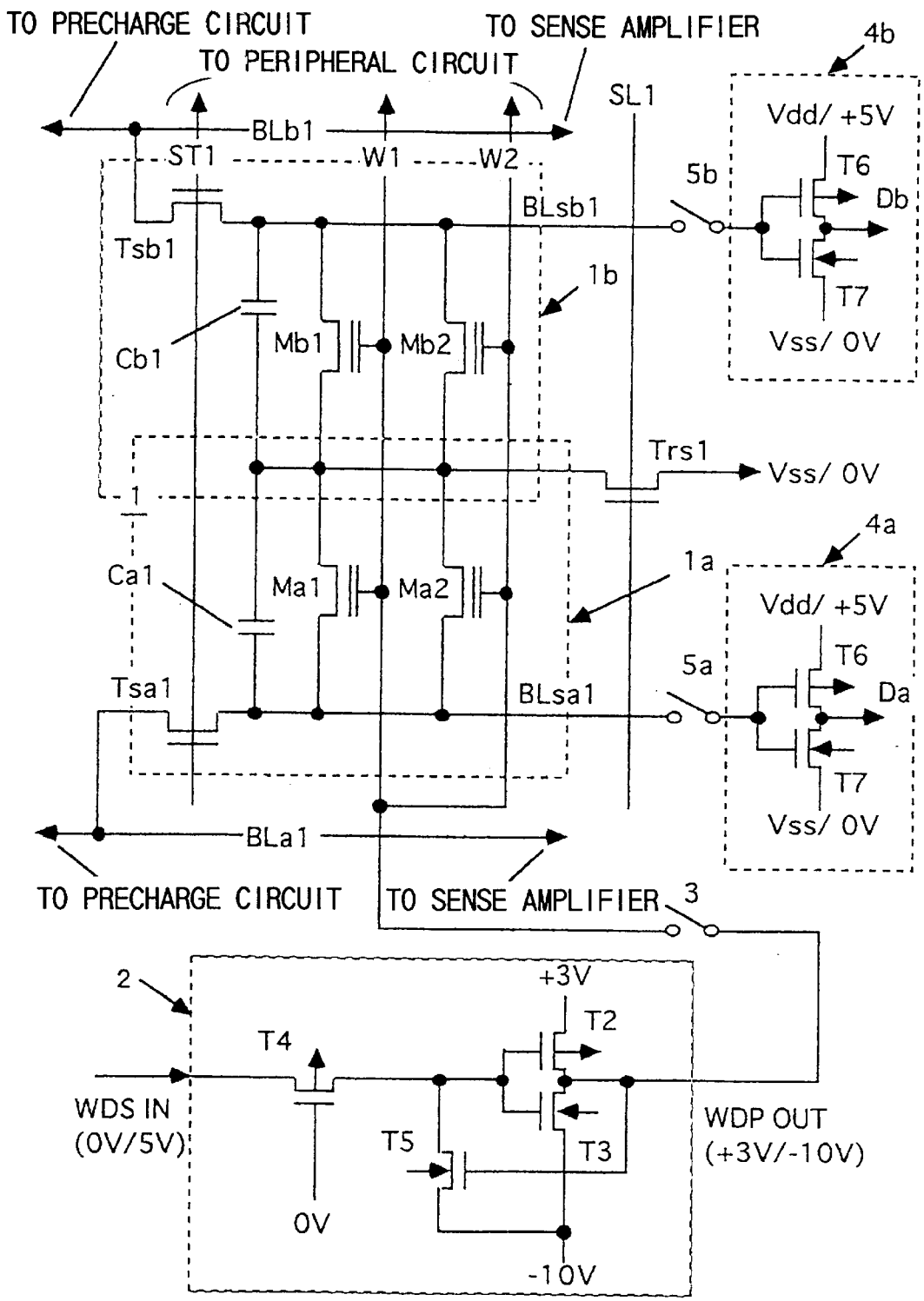
F I G. 1

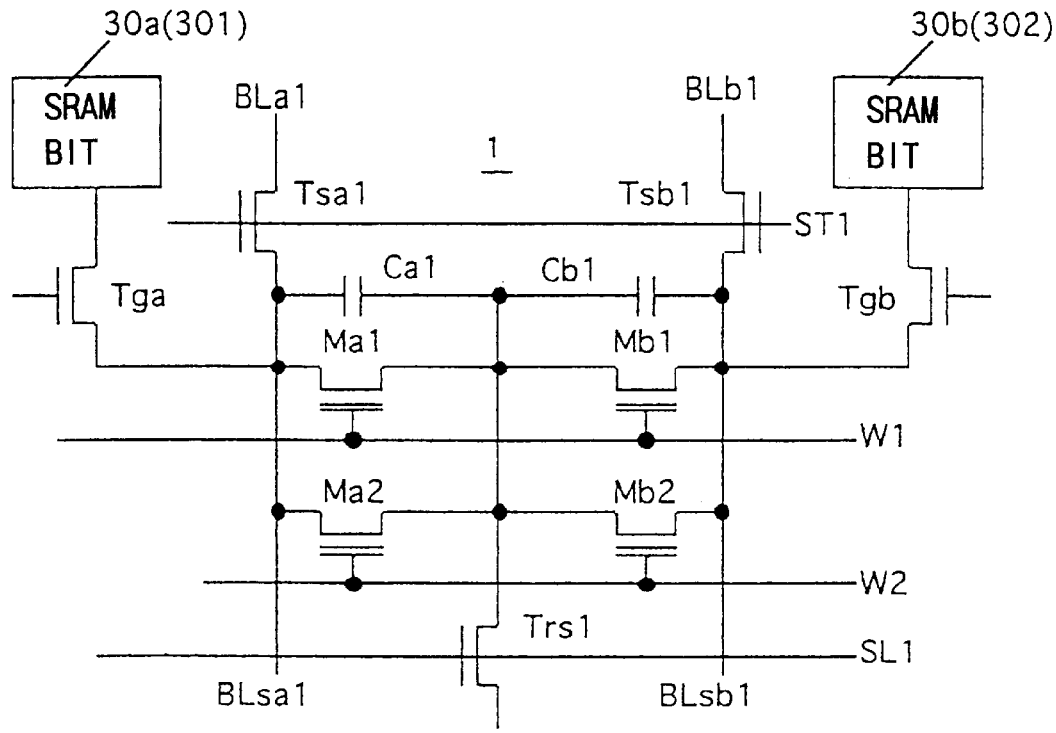
FIG. 10A
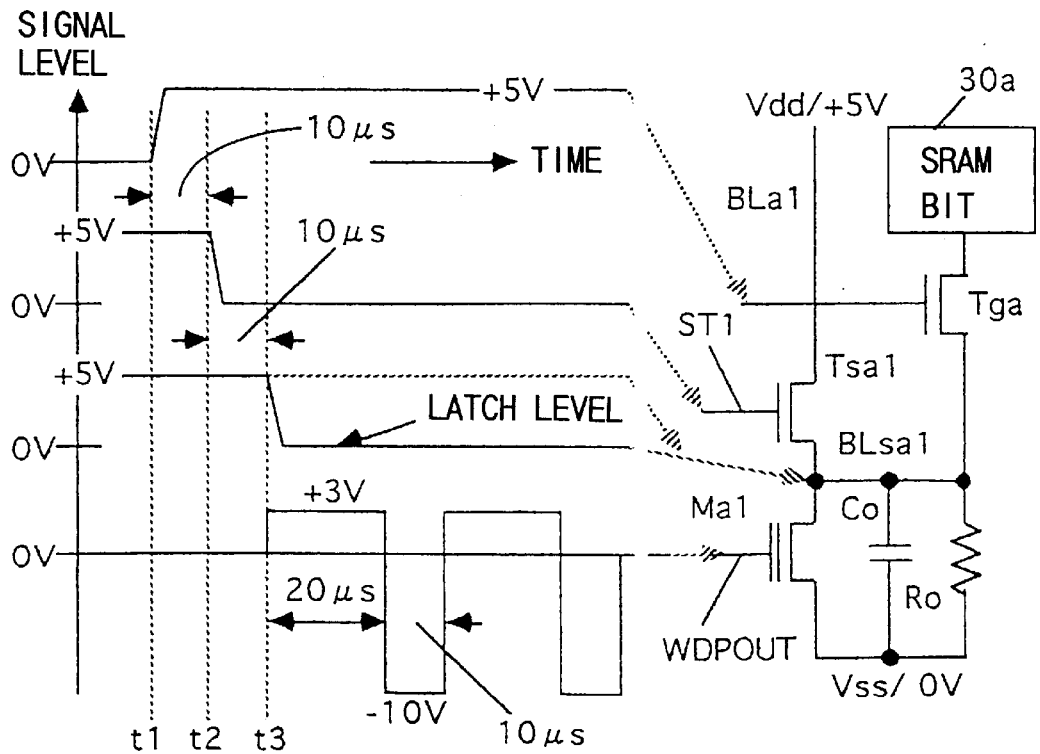
FIG. 10B
FIG. 10C

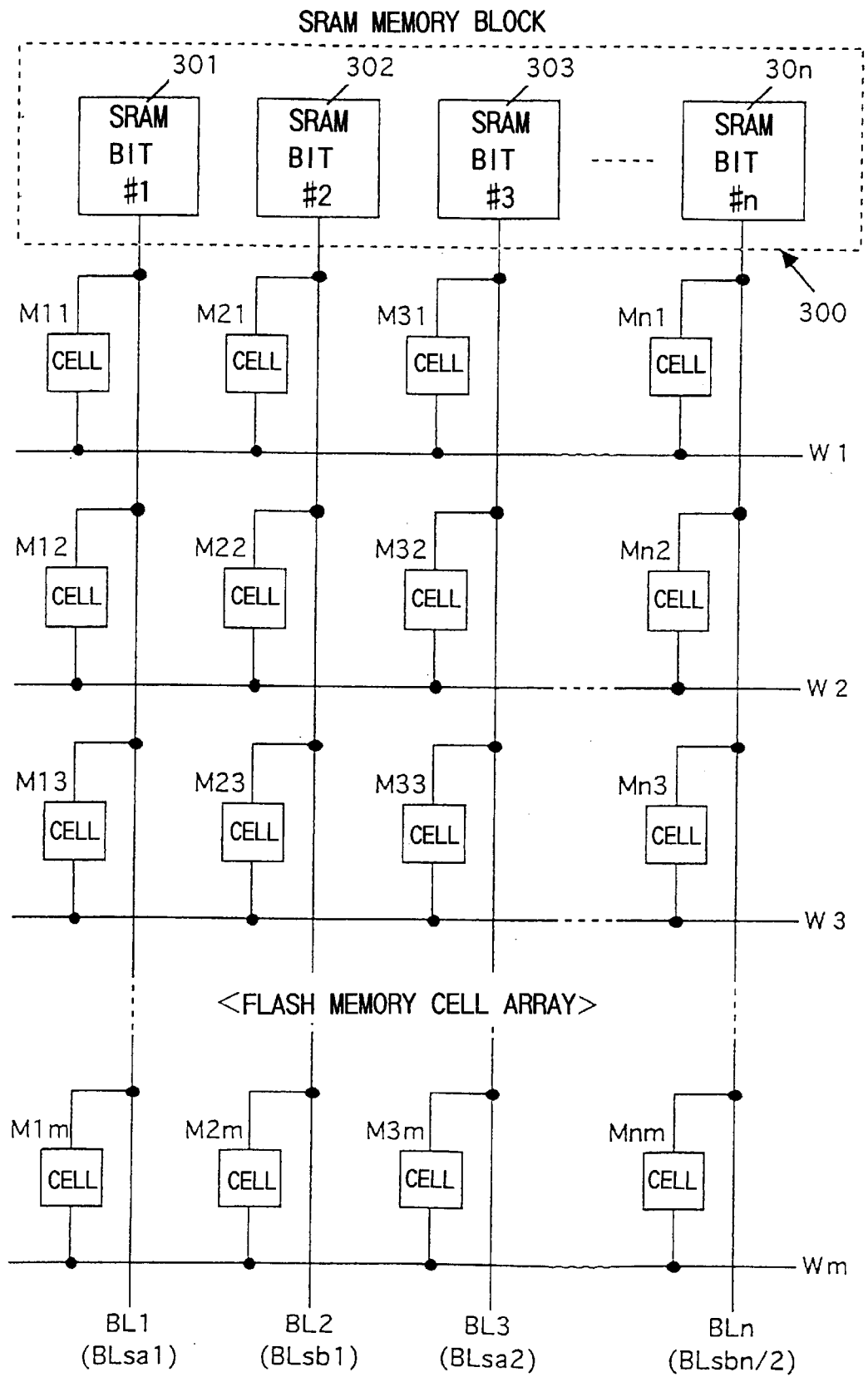
F I G. 13

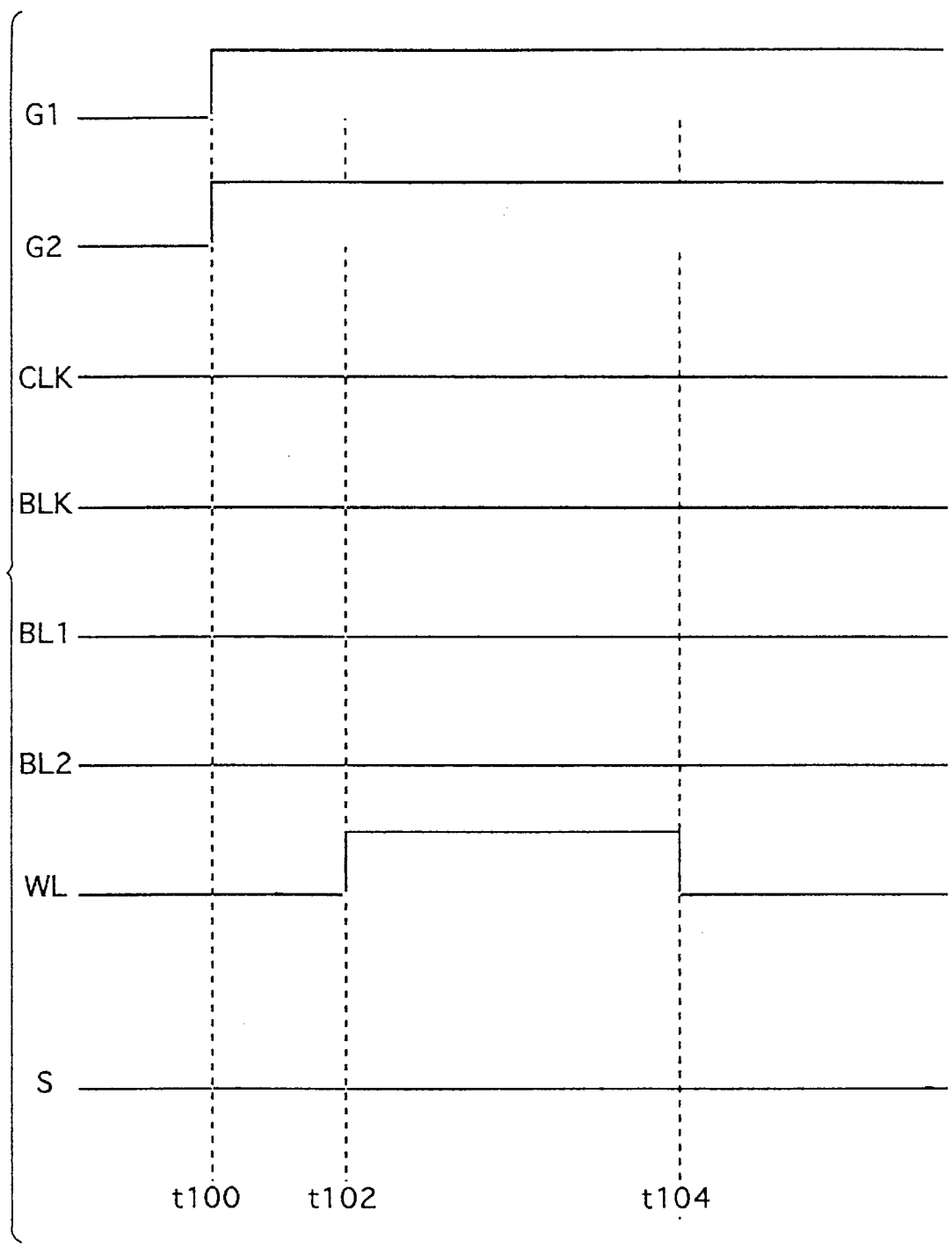
F I G. 2 2

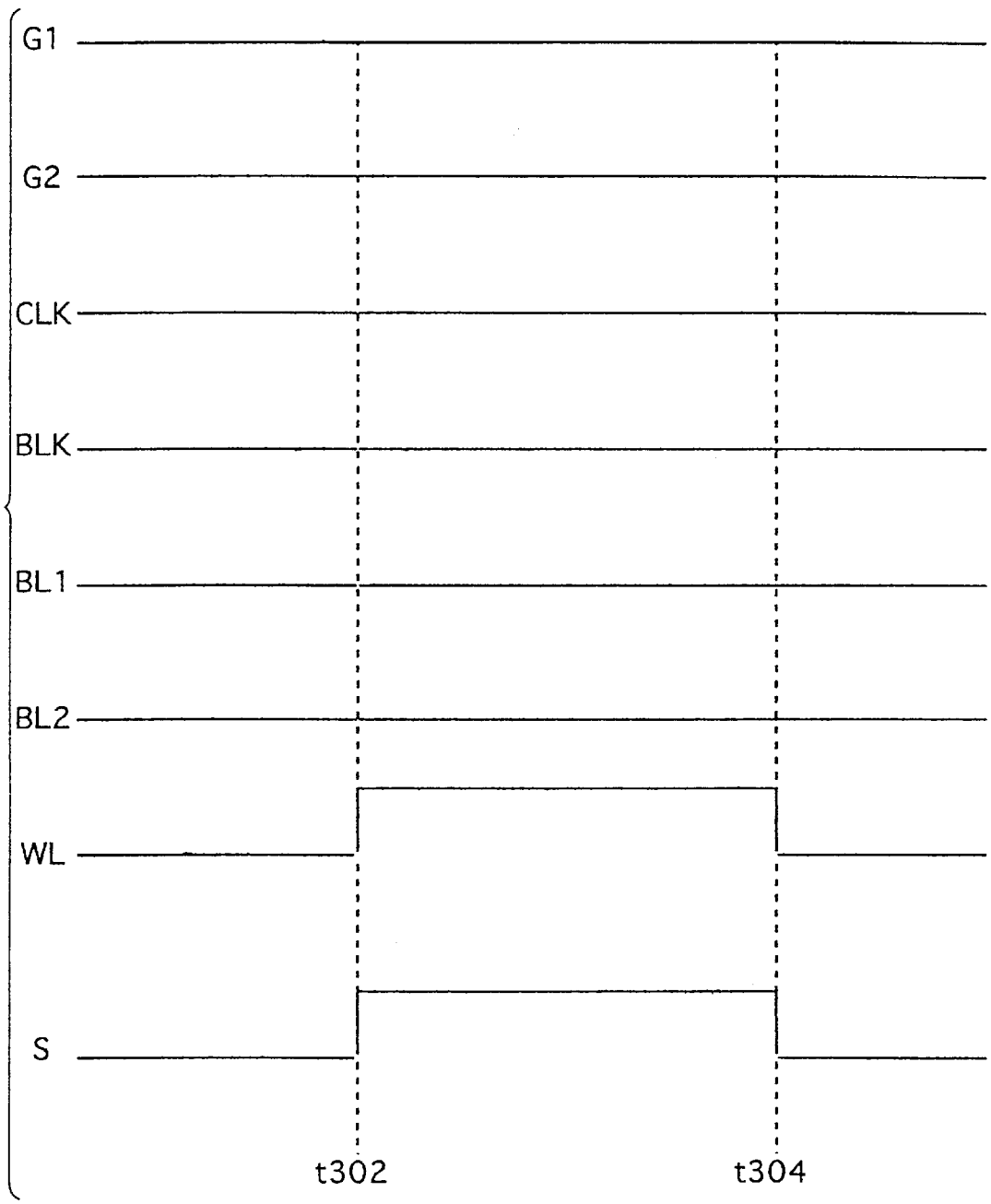
F I G. 2 4

NONVOLATILE SEMICONDUCTOR MEMORY DEVICE CAPABLE OF SUPPRESSING A VARIATION OF THE BIT LINE POTENTIAL

FIELD OF THE INVENTION

The present invention relates to an improvement in nonvolatile semiconductor memory device (EEPROM) which can electrically rewrite/erase information.

BACKGROUND ART (Description of Prior Art)

Nonvolatile semiconductor memory devices can be roughly classified, on the basis of their stored information rewrite operations, into (1) a scheme for write access by hot electrons/erasure by a tunnel current and (2) a scheme for write access by a tunnel current/erasure by a tunnel current.

A flash EEPROM is a typical nonvolatile semiconductor memory device which employs the former scheme (1). In the flash EEPROM, a write voltage (high voltage Vpp) is applied to both the control gate and the drain electrode of a MOS transistor which constitutes a memory cell to inject hot electrons into the floating gate, thereby performing a write operation.

In such an EEPROM, the threshold value of the memory cell transistor changes depending on the channel length of the memory cell MOS transistor, the thickness (tunnel oxide film thickness) of an insulating film through which a tunnel current flows under the floating gate, a change in electrode voltage between the source and drain, or the like. As a result, the distribution (data "0") of threshold voltage VTH after information is written in each memory cell transistor largely varies, as shown in the upper-side hatched graph of FIG. 7A or 7B.

On the other hand, in an erase operation, the control gate of the memory cell MOS transistor is grounded. An erase voltage (Vpp) is applied to the source electrode (or the drain electrode) to extract electrons captured by the floating gate to the source electrode (or the drain electrode) side in the form of a tunnel current. In this erase operation as well, the distribution (data "1") of threshold voltage VTH of the memory cell transistor after the erase operation largely varies, as shown in the lower-side hatched graph of FIG. 7A or 7B, depending on a variation in the control gate voltage (word line voltage), the drain voltage (bit line voltage), the film thickness of the tunnel oxide film, or the like, as in the write operation.

An NAND type EEPROM is a typical nonvolatile semiconductor memory device which employs the latter scheme (2). In this NAND type EEPROM, the write and erase operations are performed by a tunnel current from the floating gate of a MOS transistor which constitutes a memory cell.

The tunnel current of the scheme (2) varies depending on a variation in the word line voltage (control gate voltage), the bit line voltage (drain voltage), the film thickness of the tunnel oxide film, or the like, as in the above-described erase operation of the scheme (1). For this reason, in the scheme (2) as well, the distributions of threshold voltage VTH of the memory cell transistor in the write and erase operations largely vary, as shown in the upper- and lower-side hatched graphs of FIG. 7C.

In the example shown in FIG. 7B, of the variations in threshold voltage VTH, the high-voltage side variations (data "0" write operation) are distributed on the upper side of the read operation voltage (+5 V of TTL level) of the EEPROM, so no serious problem is posed. However, the low-voltage side variations (data "1" erase operation) in threshold voltage VTH are distributed in the range of the read operation voltage (+5 V of TTL level) of the EEPROM and largely affect the data read operation.

(Problem)

A device in which the variation in threshold value is suppressed is disclosed in Japanese Patent Application No. 6-222734 (corresponding to U.S. Ser. No. 08/516,830 filed on Aug. 18, 1995) filed by the present applicant on Aug. 25, 1994. According to the this prior invention, variations in threshold values of a large number of memory cell transistors can be suppressed and minimized.

In this prior invention, however, after electrons are extracted from the floating gate of the memory cell transistor, the bit line potential varies. This potential variation may adversely affect the subsequent circuit operation (e.g., decrease the set potential accuracy in precharging the sub-bit line).

In addition, if a leakage current flows to the bit line, the bit line potential decreases with the elapse of time. This decrease in potential may also adversely affect the subsequent circuit operation (e.g., decrease the accuracy of the bit line set potential in the write operation).

Furthermore, the data write operation in the memory cell of the EEPROM requires a time longer than that for a normal main memory device (DRAM or SRAM), and this point also needs an improvement.

(Object)

The present invention has been made in consideration of the above situations, and has as its first object to provide a nonvolatile semiconductor memory device which suppresses a variation in bit line potential (sub-bit line potential) when data is written in a memory cell transistor.

It is the second object of the present invention to provide a nonvolatile semiconductor memory device which minimizes a variation in threshold value of a memory cell transistor after a data erase operation and also suppresses a decrease in bit line potential (or a sub-bit line potential).

It is the third object of the present invention to provide a nonvolatile semiconductor memory device which can write data in a memory cell transistor at a high speed.

DISCLOSURE OF INVENTION

In order to achieve the first object, in the nonvolatile semiconductor memory device of the present invention, a bit line (sub-bit line) for transmitting information to be written to a memory cell transistor has static memory means (flip-flop circuit) for holding the potential of the bit line.

In order to achieve the second object, in the nonvolatile semiconductor memory device of the present invention, a specific bit line (sub-bit line) for transmitting information to be written to a memory cell transistor has small current supply means for appropriately supplying a small current.

In order to achieve the third object, in the nonvolatile semiconductor memory device of the present invention, a bit line (sub-bit line) for transmitting information to be written in a memory cell transistor has a flip-flop circuit for holding the potential of the bit line, and this flip-flop circuit is used as high-speed temporary memory means (one-bit memory cell of an SRAM).

In the nonvolatile semiconductor memory device of the present invention, one potential (+3 V) of a word line driving signal (WDP) is applied to the control gate of a target memory cell transistor (Ma1) to check whether this memory cell transistor is turned on with this one potential (+3 V).

If the memory cell transistor is turned on, the bit line (sub-bit line) potential decreases through the drain and source of the target memory cell transistor. Even when the other potential (−10 V) of the word line driving signal (WDP) is subsequently applied to the control gate of the memory cell transistor, no electron discharge from the floating gate due to a tunnel current occurs (overerase prevention).

When the memory cell transistor is not turned on with one potential (+3 V) of the first word line driving signal (WDP) (the threshold value of the target memory cell transistor is larger than a desired value), the bit line potential does not decrease. When the other potential (−10 V) of the word line driving signal (WDP) is applied to the control gate immediately thereafter, some accumulated charges are extracted from the floating gate of the target memory cell transistor in the form of a tunnel current. The threshold value of the target memory cell transistor slightly decreases in correspondence with the extracted charges.

When one potential (+3 V) of the word line driving signal (WDP) is applied again to the memory cell transistor having the slightly decreased threshold value, and the memory cell transistor is not turned on yet (the threshold value of the target memory cell transistor is still larger than the desired value), the bit line potential does not decrease. When the other potential (−10 V) of the word line driving signal (WDP) is applied to the control gate immediately thereafter, accumulated charges are extracted again from the floating gate of the target memory cell transistor in the form of a tunnel current. The threshold value of the target memory cell transistor further decreases in correspondence with the extracted charges.

When one potential (+3 V) of the word line driving signal (WDP) is applied to the memory cell transistor having the further decreased threshold value again, and the memory cell transistor is turned on (i.e., when the threshold value of the target memory cell transistor decreases to the desired value), the bit line potential decreases through the drain and source of the target memory cell transistor in the ON state. Even when the other potential (−10 V) of the word line driving signal (WDP) is applied to the control gate of the memory cell transistor, no electron discharge from the floating gate due to a tunnel current occurs (overerase prevention). At this point of time, data in the target memory cell transistor is erased so that this transistor properly has the desired threshold value without causing overerasure.

If there is no static memory means according to the first object of the present invention, the target memory cell transistor is turned on/off in synchronism with the change in level of the word line driving signal after completion of the erase operation, and the bit line (sub-bit line) potential slightly varies.

However, when there is the static memory means according to the first object of the present invention, the bit line (sub-bit line) potential is latched by the static memory means after the threshold value of the target memory cell transistor becomes the desired value. Therefore, the bit line (sub-bit line) potential is fixed to the latched potential, and the potential variation is eliminated.

In addition, when there is the small current supply means according to the second object of the present invention, even when a leakage current flows to a specific bit line in the data write operation after completion of the erase operation, the decrease in bit line potential is suppressed by supplying a small current for compensating for this leakage current to the bit line.

Furthermore, if there is no flip-flop circuit (one-bit memory cell of an SRAM) according to the third object of the present invention, a data write time is taken until several pulses of the word line driving signal (WDP) are repeatedly applied to write the potential information of the sub-bit line in the data-erased memory cell transistor. This prolongs the write time in the EEPROM, so this device is not suitable for an application which requires a high-speed operation.

However, since the flip-flop circuit according to the third object of the present invention is a one-bit SRAM memory cell, the data write operation in the memory cell is completed within a very short time (normally on the nanosecond order). Once data is written in the SRAM memory cell, this data is held until the next data write timing. The data held in the SRAM memory cell may be completely written in the memory cell transistor of the EEPROM until the next write timing. In this case, even if several hundreds microseconds are taken to write data in the memory cell transistor in the EEPROM, the data write operation is apparently completed within the write time in the SRAM bit and the time necessary for the peripheral circuit operation (several tens nanoseconds or less) when viewed from the outside of the EEPROM. Therefore, a flash memory capable of performing a high-speed write operation can be constituted.

BRIEF DESCRIPTION OF DRAWINGS

FIG. 1 is a circuit diagram for explaining the arrangement of a nonvolatile semiconductor memory device according to an embodiment of the present invention;

FIG. 10A is a view for explaining the arrangement of a nonvolatile semiconductor memory device according to the fifth embodiment of the present invention;

FIGS. 10B and 10C are views for explaining the circuit operation of the device shown in FIG. 10A;

FIG. 13 is a circuit diagram for explaining the arrangement of a nonvolatile semiconductor memory device according to the sixth embodiment of the present invention;

FIG. 22 is a timing chart for explaining a circuit operation (erase operation) of the embodiment in FIG. 19;

FIG. 24 is a timing chart for explaining a circuit operation (read operation) of the embodiment in FIG. 19.

PREFERRED EMBODIMENTS

Figure 2:
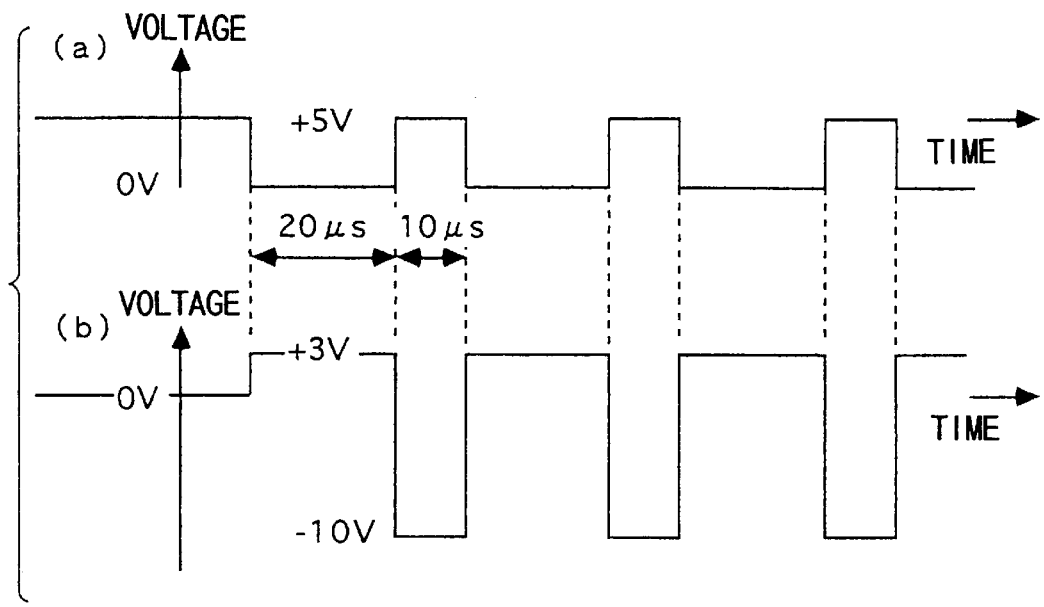
FIG. 2 is a view for explaining the circuit operation of a word line driving pulse generation circuit (or a level shifter) used in the device shown in FIG. 1.

The arrangements and operations of nonvolatile semiconductor memory devices (EEPROMS) of the present invention will be described below with reference to the accompanying drawings.

FIG. 1 is a circuit diagram showing the main part of an EEPROM according to an embodiment of the present invention. Referring to FIG. 1, memory cell array 1 includes bit line selection transistor Tsa1 which selectively connects main bit line BLa1 to sub-bit line BLsa1, nonvolatile memory cell transistors Ma1 and Ma2 whose drains are connected to sub-bit line BLsa1, and bit line capacitor Ca1 connected between the common source circuit of memory cell transistors Ma1 and Ma2 and sub-bit line BLsa1. Each of nonvolatile memory cell transistors Ma1 and Ma2 has an n-channel MOS transistor structure having a control gate and a floating gate. Nonvolatile charge information is held in the floating gate.

A sub-bit line means a conductive line connected to the drain (or source) of a memory cell transistor. A main bit line is a conductive line connected to the sub-bit line through a switch means.

Memory cell array 1 also includes bit line selection transistor Tsb1 which selectively connects main bit line BLb1 to sub-bit line BLsb1, nonvolatile memory cell transistors Mb1 and Mb2 whose drains are connected to sub-bit line BLsb1, and bit line capacitor Cb1 connected between the common source circuit of memory cell transistors Mb1 and Mb2 and sub-bit line BLsb1. Each of nonvolatile memory cell transistors Mb1 and Mb2 also has a control gate and a floating gate, and nonvolatile charge information is held in the floating gate.

The common source circuit of memory cell transistors Ma1, Ma2, Mb1, and Mb2 is selectively connected to a ground circuit (or negative power supply Vss/0 V circuit) through source-side selection transistor Trs1.

Bit line selection gate line ST1 is connected to the gates of bit line selection transistors Tsa1 and Tsb1. Source-side selection gate line ST1 is connected to the gate of source-side selection transistor Trs1. Word line W1 is connected to the gates of memory cell transistors Ma1 and Mb1, and word line W2 is connected to the gates of memory cell transistors Ma2 and Mb2.

The arrangement of each memory cell transistor (Ma1 and Ma2/Mb1 and Mb2) will be described below in detail.

The floating gate has a size of 3 $\mu$m×1 $\mu$m and contacts part of the channel and source/drain through a gate oxide film.

The channel has a size of 1 $\mu$m×1 $\mu$m, and the thickness of the gate oxide film is 10 nm.

An insulating film between the floating gate and the control gate consists of an ONO film (silicon oxide film/silicon nitride film/silicon oxide film) which has a thickness of 15 nm in conversion into a silicon oxide film.

Bit line selection transistor Tsa1, memory cell transistors Ma1 and Ma2, and bit line capacitor Ca1 constitute memory cell block 1a. Bit line selection transistor Tsb1, memory cell transistors Mb1 and Mb2, and bit line capacitor Cb1 constitute memory cell block 1b.

In FIG. 1, for the illustrative convenience, two memory cell transistors (Ma1 and Ma2 or Mb1 and Mb2) are arranged in each memory cell block. However, the number of memory cell transistors constituting each memory cell block can be increased in fact (e.g., 256 to 1024 memory cell transistors per block). In this case, the number of word lines (W1 and W2) is also increased in correspondence with the actual number of memory cell transistors.

Memory cell block 1a can have a DRAM function which uses the combined capacitance of bit line capacitor Ca1 and the stray capacitance (parasitic capacitance) of sub-bit line BLsa1 (bit line equivalent capacitance Co; about 100 fF to 300 fF) as an information memory means. More specifically, bit line equivalent capacitance Co is charged with the voltage of main bit line BLa1 in the ON state of bit line selection transistor Tsa1, and the voltage of charged capacitance Co is periodically refreshed. With this operation, information can be stored in capacitance Co of sub-bit line BLsa1 on the basis of the same operation principle as of a DRAM.

Memory cell block 1b also has the function of a DRAM which uses the combined capacitance of bit line capacitor Cb1 and the stray capacitance (parasitic capacitance) of sub-bit line BLsb1 (bit line equivalent capacitance Co of about 100 fF to 300 fF) as an information memory means. More specifically, bit line equivalent capacitance Co is charged with the voltage of main bit line BLb1 in the ON state of bit line selection transistor Tsb1, and the voltage of charged capacitance Co is periodically refreshed. With this operation, information can be stored in capacitance Co of sub-bit line BLsb1 on the basis of the same operation principle as of a DRAM.

As described above, regarding the arrangement shown in FIG. 1 as a DRAM which uses bit line equivalent capacitance Co of sub-bit line BLsa1 (BLsb1) as a memory cell capacitor, main bit line BLa1 (BLb1) corresponds to the bit line of the DRAM, and bit line selection gate line ST1 corresponds to the word line of the DRAM.

As micropatterning of memory devices progresses along with advances in semiconductor manufacturing techniques, the stray capacitance of sub-bit line BLsa1/BLsb1 itself (electrostatic capacitance which is parasitic between the sub-bit line and a semiconductor region where the sub-bit line is formed) tends to decrease. If a capacitance of 100 to 300 fF or more can be ensured as the sum of this stray capacitance and the drain-to-source capacitances of the large number of memory cells (Ma1 and Ma2/Mb1 and Mb2), capacitor Ca1/Cb1 can be omitted.

As will be described later, in the embodiment of the present invention, the potential of sub-bit line BLsa1/BLsb1 can be clamped by contents stored in a flip-flop circuit (SRAM bit). Therefore, the bit line capacitance such as a DRAM need not be refreshed in this embodiment. In addition, when this SRAM bit is present, data need not be accumulated in capacitors Ca1 and Cb1, and capacitors Ca1 and Cb1 can be omitted from the constituent elements of the memory cell blocks. However, since the combined capacitance of bit line capacitor Ca1/Cb1 and the stray capacitance (parasitic capacitance) of sub-bit line BLsa1/BLsb1 has a function of absorbing a high-frequency pulse potential variation from sub-bit line BLsa1/Blsb1, the bit line capacitor is not a useless element.

The flip-flop circuit (SRAM bit) acts as a write buffer at a high speed relative to memory cell block 1a/1b as an EEPROM.

FIG. 1 shows part of the arrangement of an EEPROM. An actual memory cell array includes larger numbers of main/sub-bit lines, word lines, selection gate lines, selection transistors, memory cell transistors, and the like. These memory cell transistors are arranged in a matrix. A row/column decoder circuit (peripheral circuit; not shown) for specifying a predetermined memory cell in accordance with an external address input is connected to this memory cell matrix.

Sub-bit line BLsa1 is connected to charge extraction completion detection circuit 4a through switch circuit 5a, and sub-bit line BLsb1 is connected to charge extraction completion detection circuit 4b through switch circuit 5b. Each of charge extraction completion detection circuits 4a and 4b is constituted by a CMOS inverter in which p-channel MOS transistor T6 is arranged on the positive power supply Vdd (+5 V) side, and n-channel MOS transistor T7 is arranged on the negative power supply Vss (0 V) side.

Charge extraction completion detection circuit 4a generates output Da of Vss level (e.g., 0 V) when the potential of sub-bit line BLsa1 is higher than the gate threshold value (e.g., +2.5 V) of n-channel MOS transistor T7 at the time of closing switch circuit 5a, and generates output Da of Vdd level (e.g., 5 V) when the potential of sub-bit line BLsa1 is lower than the gate threshold value (e.g., 5 V−2.5 V=+2.5 V) of p-channel MOS transistor T6 at the time of closing switch circuit 5a.

More specifically, when output Da from charge extraction completion detection circuit 4a is at Vss level (=0 V), charge extraction from the floating gate of target memory cell transistor Ma1 (or Ma2) connected to sub-bit line BLsa1 has not been completed yet. When output Da changes to Vdd level (=5 V), it is detected that charge extraction from the floating gate of target memory cell transistor Ma1 (or Ma2) connected to sub-bit line BLsa1 has been completed.

Similarly, when output Db from charge extraction completion detection circuit 4b is at Vss level (=0 V), charge extraction from the floating gate of target memory cell transistor Mb1 (or Mb2) connected to sub-bit line BLsb1 has not been completed yet. When output Db changes to Vdd level (=5 V), it is detected that charge extraction from the floating gate of target memory cell transistor Mb1 (or Mb2) connected to sub-bit line BLsb1 has been completed.

Word lines W1 and W2 are commonly connected to the output circuit of word line driving pulse generation circuit 2 through word line switch circuit 3. This circuit 2 comprises a CMOS inverter (p-channel transistor T2 and n-channel transistor T3) connected to a positive power supply of +3 V and a negative power supply of −10 V, normally ON p-channel transistor T4 on the input side (when the gate potential is controlled, the normally ON p-channel transistor serves as a selection transistor), and n-channel transistor T5 which positively feeds back an output from the CMOS inverter to the input side.

Word line driving pulse generation circuit 2 generates pulse output WDPOUT whose potential changes within the range of +3 V to −10 V in accordance with the signal potential of input WDSIN whose potential changes within the range of 0 V to +5 V.

More specifically, upon receiving word line driving signal input WDSIN having a waveform as shown in FIG. 2(a), word line driving pulse generation circuit 2 generates word line driving pulse output WDPOUT having a waveform as shown in FIG. 2(b). This circuit 2 has a function of level-shifting the pulse of 0 V/+5 V as shown in FIG. 2(a) to the pulse of +3 V/−10 V as shown in FIG. 2(b).

Word line driving pulse output WDPOUT of +3 V/−10 V as shown in FIG. 2(b) is supplied to word lines W1 and W2 when word line switch circuit 3 is in the ON state. With this arrangement, all memory cell transistors (whose drains are applied with a sufficient sub-bit line potential) with their control gates connected to word lines W1 and W2 can be erased at once to a desired threshold value with word line driving pulse output WDPOUT of +3 V/−10 V (full erase flash EEPROM operation in units of all bits or in units of memory blocks).

The circuit operation (erase/leakage current compensation operation) of bit line selection transistor Tsa1 and memory cell transistor Ma1 in the EEPROM shown in FIG. 1 will be described below with reference to FIGS. 3A an 3B. FIG. 3B shows a circuit formed by simplifying the memory configuration in FIG. 1, and the waveforms of voltages applied to the respective portions are shown in FIG. 3A.

Figures 3A, 3B:
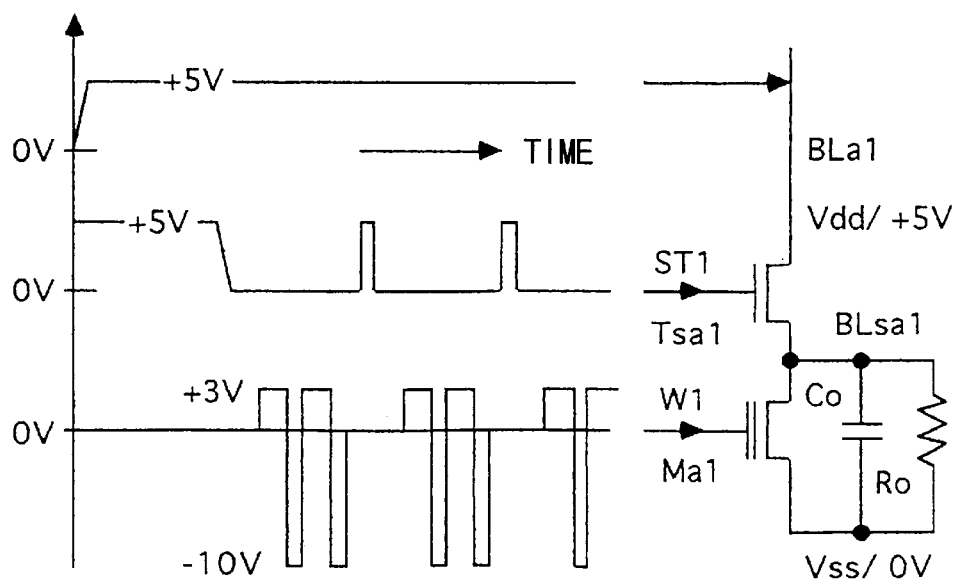
FIGS. 3A and 3B are views for explaining the circuit operations of a bit line selection transistor and a memory cell transistor in the device shown in FIG. 1.

Referring to FIG. 3B, main bit line BLa1 is connected to the drain of n-channel MOS memory cell transistor Ma1 through the drain and source of bit line selection transistor Tsa1. Bit line equivalent capacitance Co and leakage current component equivalent resistance Ro are connected between the drain and source of transistor Ma1 to be parallel to each other.

Bit line equivalent capacitance Co represents the combined value of the stray capacitance of sub-bit line BLsa1 and bit line capacitor Ca1. Leakage current component equivalent resistance Ro represents a resistance value of the path of a current which leaks from sub-bit line BLsa1 to the source circuit (Vss/0 V) of memory cell transistor Ma1. Assume that bit line equivalent capacitance Co has a value of about 1 pF, and equivalent resistance Ro has a value of about 1,000 MΩ.

Figure 7:
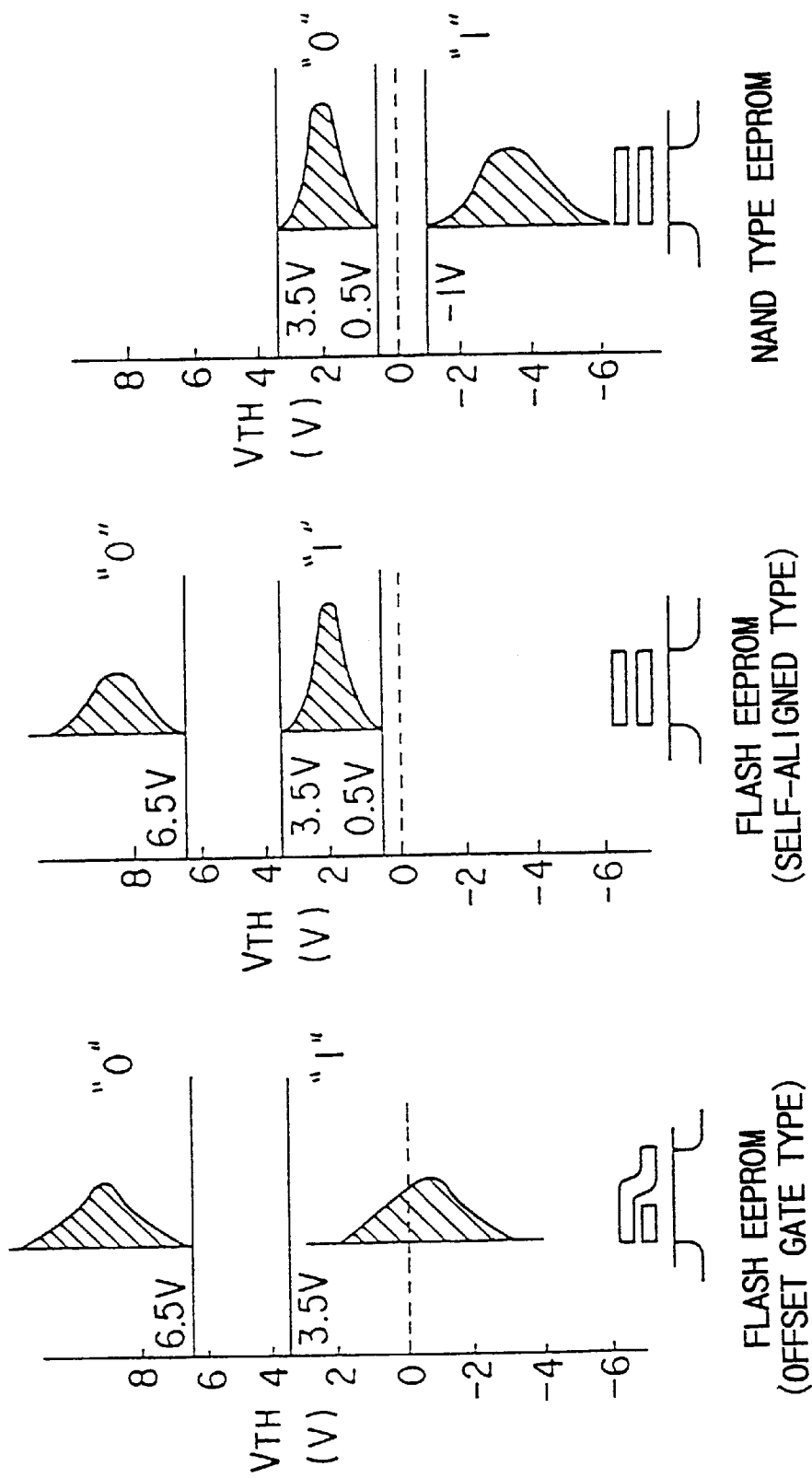
FIGS. 7A, 7B, and 7C are views for explaining the structures of conventional EEPROM cells and the threshold value distributions of these cells.

Assuming that threshold voltage VTH of nonvolatile memory cell transistor Ma1 is 6.5 V or more in the initial state, an erase operation will be described first (FIG. 7B).

While a potential of +5 V as shown on the left side of the middle stage of FIG. 3A is applied to bit line selection gate line ST1, a potential of +5 V as shown at the upper stage of FIG. 3A is applied to main bit line BLa1. Transistor Tsa1 is turned on, and sub-bit line BLsa1 is precharged to about +5 V (potential reference 0 V=Vss is set in the source circuit of memory cell transistor Ma1).

Thereafter, when the potential of bit line selection gate line ST1 is lowered to 0 V, as shown on the left side close to the center of the middle stage of FIG. 3A, transistor Tsa1 is turned off, and sub-bit line BLsa1 is electrically disconnected from main bit line BLa1 and set in a floating state. In this state, the precharge potential of +5 V of sub-bit line BLsa1 is maintained by charges stored in sub-bit line equivalent capacitance Co as a microcapacitance (1 pF).

Subsequently, a word line driving pulse as shown on the left side close to the center of the lower stage of FIG. 3A is applied to the control gate of memory cell transistor Ma1 through word line W1. As this pulse, output WDPOUT from word line driving pulse generation circuit 2 in FIG. 1 is used. A period (0 V period) shown at the lower stage of FIG. 3A, during which no word line driving pulse is generated, corresponds to the OFF period of switch circuit 3 in FIG. 1. While this pulse is generated, switch circuit 3 is in the ON state.

When switch circuit 3 is turned on, a voltage of +3 V is applied to the control gate of memory cell transistor Ma1 for a short period of time (e.g., 20 $\mu$s). Since it is assumed that threshold voltage VTH is 6.5 V or more in the initial state, transistor Ma1 is kept in the OFF state. At this point of time, if a decrease in sub-bit line potential caused by a leakage current flowing through equivalent resistance Ro is still negligible, the floating state (+5 V) of sub-bit line BLsa1 is maintained.

When a word line driving pulse of −10 V is applied to the control gate of memory cell transistor Ma1 for a short period of time (e.g., 10 $\mu$s), a tunnel current flows between the floating gate and the drain of memory cell transistor Ma1 with its drain being precharged to +5 V. Some charges are extracted from the floating gate by this tunnel current. Consequently, threshold voltage VTH of memory cell transistor Ma1 is slightly lowered.

Even when threshold voltage VTH of memory cell transistor Ma1 slightly decreases, memory cell transistor Ma1 is not turned on as long as the threshold voltage is higher than the word line driving pulse of +3 V.

When memory cell transistor Ma1 is kept in the OFF state, and a sufficient precharge potential is applied to the drain, charges are gradually extracted from the floating gate in the form of a tunnel current every time the word line driving pulse of −10 V is applied, so that threshold voltage VTH gradually decreases.

However, the charge voltage (sub-bit line precharge potential) of bit line equivalent capacitance Co is also lowered with the elapse of time by the tunnel current flowing to the floating gate of memory cell transistor Ma1 and the leakage current flowing to the leakage current component equivalent resistance Ro. If the precharge potential is excessively lowered (i.e., if the drain potential of memory cell transistor Ma1 becomes too low), no tunnel current flows to the floating gate even when the pulse of −10 V is applied to the control gate of transistor Ma1. As a result, the gradual decreasing operation of threshold voltage VTH of transistor Ma1 stops before the threshold voltage reaches a desired value (e.g., +2.5 V) corresponding to the word line driving pulse of +3 V.

In the arrangement shown in FIGS. 3A and 3B, to prevent the decrease in sub-bit line precharge potential, bit line selection transistor Tsa1 is intermittently and instantaneously turned on while word line driving pulse output WDPOUT is applied to word line W1, thereby injecting charges in a small amount from main bit line BLa1 into sub-bit line BLsa1 in the floating state.

More specifically, when the potential of sub-bit line BLsa1 in the floating state is lowered to some extent, switch circuit 3 shown in FIG. 1 is appropriately turned off, and application of word line driving pulse output WDPOUT to word line W1 is stopped, as shown at the center of the lower stage of FIG. 3A (the stop period is set to be equal to or shorter than a 30-$\mu$s period of pulse WDPOUT, i.e., about 7 $\mu$s). As shown at the center of the middle stage of FIG. 3A, a short pulse of +5 V (e.g., a pulse having a width of 3 $\mu$s and a total time interval of 2 $\mu$s before and after the pulse) is applied to bit line selection gate line ST1 during the stop period of word line driving pulse output WDPOUT (7 $\mu$s). With this operation, bit line selection transistor Tsa1 is instantaneously turned on to return sub-bit line BLsa1 having a decreased potential to the full precharged state.

With the combination of the pulses as shown at the middle stage/lower stage of FIG. 3A, even when a bit line leakage current flows, the potential (about +5 V) of sub-bit line BLsa1 in the floating state is ensured. In this state, by repeatedly applying word line driving pulse output WDPOUT of −10 V, charges are gradually extracted from the floating gate of memory cell transistor Ma1.

As the result of charge extraction, when threshold voltage VTH of memory cell transistor Ma1 is lowered to the desired value (+2.5 V), memory cell transistor Ma1 is turned on with immediately subsequent word line driving pulse output WDPOUT of +3 V, and the potential of sub-bit line BLsa1 is lowered to 0 V. Charge extraction from the floating gate of memory cell transistor Ma1 is stopped, and threshold voltage VTH of memory cell transistor Ma1 properly becomes the desired value of +2.5 V (this is the erase state of memory cell transistor Ma1).

The end of the erase operation of memory cell transistor Ma1 is detected by charge extraction completion detection circuit 4a in FIG. 1, which is connected to sub-bit line BLsa1 (Da="1"). After the end of the erase operation is detected, application of the 3-$\mu$s wide pulse shown at the center of the middle stage of FIG. 3A is also stopped.

When the above erase operation is simultaneously performed for all the memory cell transistors (Ma1 and Ma2) of memory cell block 1a in FIG. 1, a full erase operation (flash erasure) in units of blocks is realized. When this erase operation is simultaneously performed for all the memory cell blocks, a full erase operation in units of memory chips is realized. When this erase operation is sequentially performed for the individual memory cell transistors, an erase operation in units of bits is realized.

In all of the erase operations, the sub-bit line potential during the erase operation is maintained at a predetermined value (about +5 V). In addition, since charge extraction from the floating gate of the memory cell transistor is gradually performed while sequentially comparing the sub-bit line potential with a predetermined word line potential (+3 V), threshold voltages VTH of all the memory cell transistors can properly converge to the desired value (+2.5 V).

This converging operation can be completed with only 10 pulses of word line driving pulse output WDPOUT (as long as about 300 $\mu$s assuming that one pulse is 30 $\mu$s). Therefore, the flash erase operation in units of blocks or in units of memory chips can be performed at a high speed (within 300 $\mu$s).

A mechanism for preventing overerasure when threshold voltage VTH of memory cell transistor Ma1 is lower (e.g., +2 V) than the desired value will be described next.

As in the case wherein threshold voltage VTH is higher than the desired value, potential Vss of the source line of memory cell transistor Ma1 is set at the ground potential of 0 V. After bit line selection transistor Tsa1 is turned on, and the potential of sub-bit line BLsa1 is precharged to +5 V, bit line selection transistor Tsa1 is set in an OFF state, and sub-bit line BLsa1 is set in a floating state at +5 V. In this case, bit line equivalent capacitance Co is in a charged state.

Subsequently, the word line driving pulse as shown at the lower stage of FIG. 3A is applied to word line W1. The drain of memory cell transistor Ma1 whose threshold voltage VTH is lower (+2 V) than the desired value is at the sub-bit line precharge potential (+5 V). When a pulse of +3 V is applied to the control gate, memory cell transistor Ma1 is turned on. A channel current flows between the drain and source of this memory cell transistor. Bit line equivalent capacitance Co is discharged, and the drain voltage decreases. In this case, even when a pulse of −10 V is applied to the control gate of memory cell transistor Ma1, no tunnel current flows between the floating gate and the drain. For this reason, no charges are extracted from the floating gate of memory cell transistor Ma1 whose original threshold voltage VTH is low, so that overerasure is prevented.

For the memory cell transistor whose threshold voltage VTH is lower (+2 V) than the desired value (+2.5 V), data "0" is written thereafter. Charges are injected into the floating gate to increase threshold voltage VTH (+6.5 V or more). Thereafter, when 10 pulses of word line driving pulse output WDPOUT are applied, threshold voltage VTH converges to the desired value (+2.5 V).

As described above, in the EEPROM of the present invention, for a memory cell transistor whose original threshold voltage VTH is higher than the desired value, threshold voltage VTH converges to the desired value. On the other hand, for a memory cell transistor whose original threshold voltage VTH is lower than the desired value, charge extraction from the floating gate is prevented.

Even when data in a plurality of memory cell transistors having different threshold values VTH are simultaneously erased at once, no memory cells are excessively erased, and threshold voltages VTH of almost all the memory cell transistors can accurately converge to the desired value. Therefore, the conventional "operation of equalizing the threshold values of nonvolatile memories accompanied with a pre-erase write operation" which requires a long time can be omitted in the present invention.

The erase/write/read/refresh operation of the memory device (flash memory) shown in FIG. 1 or 3B will be briefly summarized below.

"Erase Operation"

(1) The row (gate line ST1) and column (bit line BLa1/BLb1) of a cell portion (sub-bit line BLsa1/Blsb1) including one or more memory cell transistors (e.g., Ma1 and Ma2/Mb1 and Mb2) as erase targets are designated by a row/column decoder (not shown), and the selection transistor (Tsa1/Tsb1) is turned on. With this operation, the cell portion (sub-bit line BLsa1/BLsb1) is precharged to +5 V.

(2) The drains (sub-bit line BLsa1/BLsb1) of one or more memory cell transistors (Ma1 and Ma2/Mb1 and Mb2) as erase targets are precharged to +5 V. In this state, erase word line driving pulse output WDPOUT as shown in FIG. 2(b) is applied to the control gates (word line W1/W2) of one or more memory cell transistors (Ma1 and Ma2/Mb1 and Mb2) as erase targets. With this operation, the threshold values of the respective memory cell transistors (Ma1 and Ma2/Mb1 and Mb2) as erase targets converge to a desired value (e.g., +2.5 V) (all bit full erase operation; flash EEPROM operation). With this all bit full erase operation, e.g., data "1" (corresponding to a threshold value of 2.5 V) is written in all the memory cell transistors.

"Write Operation (After Erase Operation)"

(1) The row (gate line ST1) and column (bit line BLa1) of a cell portion (equivalent capacitance Co of sub-bit line BLsa1) including a memory cell transistor (e.g., Ma1) as a write target are designated by a row/column decoder (not shown), and the selection transistor (Tsa1) is turned on (when the power supply voltage of the memory is +5 V, a voltage of, e.g., +7 V is applied to the gate of selection transistor Tsa1). With this operation, the capacitance Co of the cell portion is charged to write data (voltage corresponding to "1" or "0"; "1" data corresponds to, e.g., 0 V, and "0" data corresponds to, e.g., +5 V).

(2) The drain (sub-bit line BLsa1) of the memory cell transistor (Ma1) as a write target is set at a write voltage (charge voltage of equivalent capacitance Co). A write voltage (e.g., +6 V) is applied to the control gate (word line W1) of this memory cell transistor (Ma1) to inject hot electrons corresponding to the write voltage into the floating gate of the memory cell transistor (Ma1). With this operation, a write operation in the memory cell transistor (Ma1) as a write target is performed using the cell portion (sub-bit line BLsa1) as a write buffer.

More specifically, when write data stored in sub-bit line capacitance Co is "0" (sub-bit line BLsa1=+5 V), hot electrons are injected into the floating gate of the memory cell transistor (Ma1) as a write target to increase the threshold value to, e.g., 6.5 V or more. When the write data is "1" (sub-bit line BLsa1=0 V), hot electron injection is not performed, so that the threshold value of the memory cell transistor (Ma1) as a write target is kept at 2.5 V in the erase operation.

"Read Operation"

(1) The row (gate line ST1) and column (bit line BLa1) of a cell portion (equivalent capacitance Co of sub-bit line BLsa1) including a memory cell transistor (e.g., Ma1) as a read target are designated by a row/column decoder (not shown), and the selection transistor (Tsa1) is turned on. With this operation, the potential of the cell portion (sub-bit line BLsa1) is precharged to a low voltage (e.g., +1 to 2 V) enough to prevent electron (hot electron) injection into the memory cell transistor (Ma1) as a read target. For this purpose, the column (bit line BLa1) potential in the read operation is set to be relatively low (e.g., +2.5 V).

(2) The potential of the control gate (word line W1) of the memory cell transistor (Ma1) as a read target is set to be an intermediate potential (about +4 V) between data "0" (threshold value: +6.5 V) and data "1" (threshold value: +2.5 V).

When data stored in the memory cell transistor (Ma1) as a read target is "0", this transistor (Ma1) is kept in the OFF state, and the potential of the cell portion (sub-bit line BLsa1) is the set potential (+1 to 2V). This potential is detected by a sense amplifier (not shown) connected to sub-bit line BLsa1 and externally read out as data "0".

When data stored in the memory cell transistor (Ma1) as a read target is "1", this transistor is turned on (a memory cell current flows), and the potential of the cell portion (sub-bit line Blsa1) is lowered to almost 0 V. At this time, the potential of almost 0 V is detected by the sense amplifier (not shown) connected to the sub-bit line BLsa1 and externally read out as data "1".

"Refresh Operation"

(1) Voltage information (high voltage/low voltage) stored in capacitance Co of a cell portion (sub-bit line BLsa1) is periodically read out by a sense amplifier (not shown).

(2) The sense amplifier detects the high voltage information (+5 V in the write operation and +1 to 2 V in the read operation) of sub-bit line BLsa1 and at the same time recharges sub-bit line BLsa1 with the same voltage as the detected voltage. Similarly, the sense amplifier detects the low-voltage information (0 V) of sub-bit line BLsa1 and at the same time recharges sub-bit line BLsa1 with the same voltage as the detected voltage.

In the above manner, the voltage information stored in the cell portion (sub-bit line BLsa1) is refreshed in the data read operation, or for every predetermined refresh period (this operation is the same as the refresh operation of a known DRAM). With this operation, the information (voltage information stored in capacitance Co) of the cell portion is maintained unless the information is rewritten by an external apparatus, or unless the power supply of the apparatus is turned off.

Figure 4:
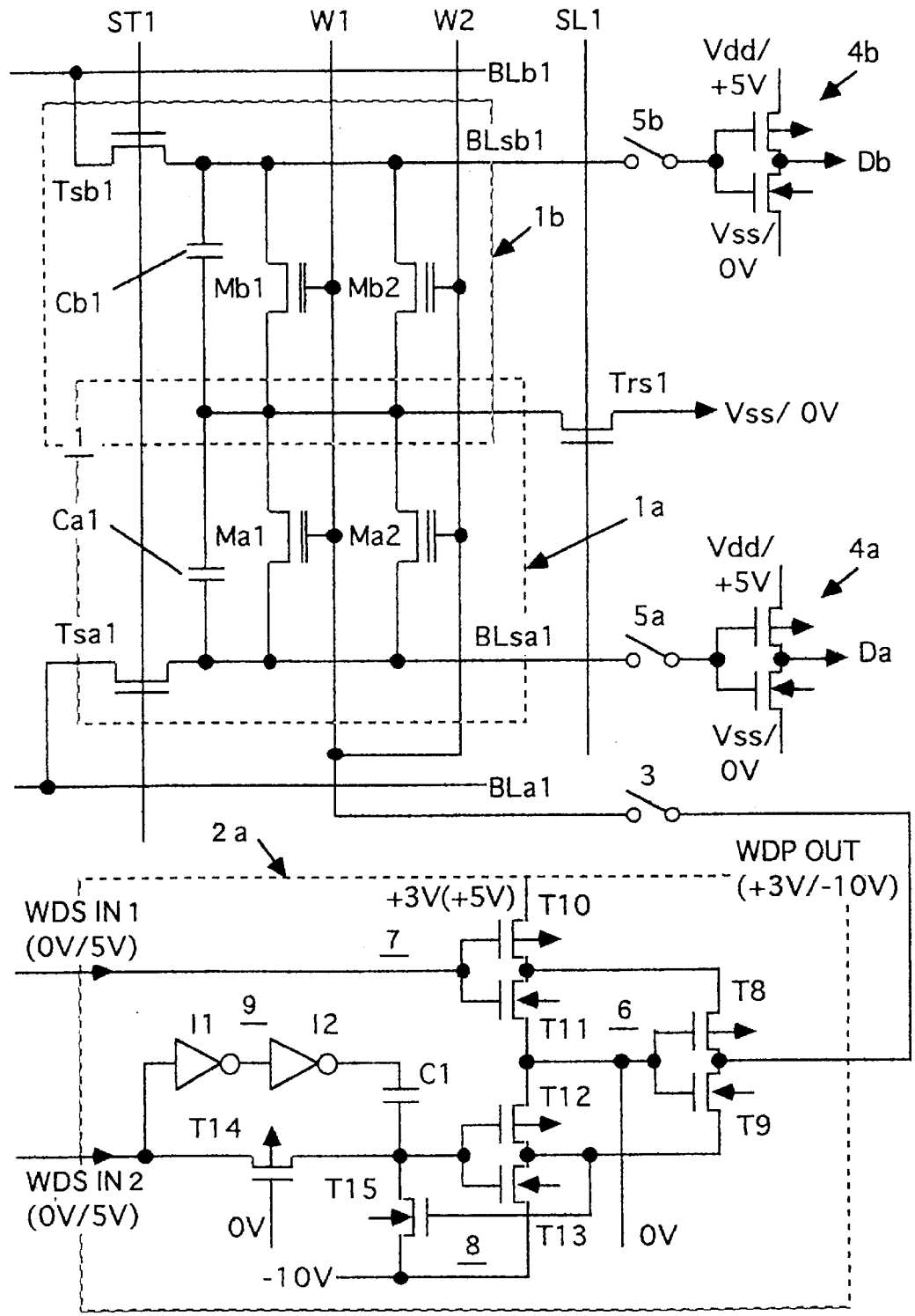
FIG. 4 is a circuit diagram for explaining the arrangement of a nonvolatile semiconductor memory device according to the second embodiment of the present invention.

A nonvolatile semiconductor memory device according to the second embodiment of the present invention will be described below with reference to FIG. 4. The arrangement of the embodiment shown in FIG. 4 is the same as that in FIG. 1 except that the arrangement of word line driving pulse generation circuit 2a is different from that of word line driving pulse generation circuit 2 in FIG. 1, and a detailed description thereof will be omitted.

Word line driving pulse generation circuit 2a comprises CMOS inverter 6 consisting of transistors T8 and T9, CMOS inverter 7 consisting of transistors T10 and T11, CMOS inverter 8 consisting of transistors T12 and T13, speed-up circuit 9 (for increasing the rising/falling rate of an input pulse to CMOS inverter 8) consisting of a series circuit of inverters I1 and I2 and capacitor C1, normally ON transistor T14 (when the gate potential is controlled, this transistor serves as a selection transistor), and positive feedback transistor T15. The drains of transistor T11 and transistors T12 are connected to each other and connected to the input terminal of CMOS inverter 6. A voltage of 0 V is applied to the connection point.

The positive power supply (on the source side of p-channel MOS transistor T10) of CMOS inverter 7 is set at a voltage of +3 V (or +5 V) corresponding to the positive pulse potential of word line driving pulse output WDPOUT, and the output terminal of CMOS inverter 7 is connected to the source of p-channel MOS transistor T8.

The negative power supply (on the source side of n-channel MOS transistor T13) of CMOS inverter 8 is set at a voltage of −10 V corresponding to the negative pulse potential of word line driving pulse output WDPOUT, and the output terminal of CMOS inverter 8 is connected to the source of n-channel MOS transistor T9.

The source of n-channel MOS transistor T11 and the drain of p-channel MOS transistor T12 are connected to the input terminal of CMOS inverter 6. The output terminal of speed-up circuit 9 and the drain of n-channel MOS transistor T15 are connected to the input terminal of CMOS inverter 8, and the gate of transistor T15 is connected to the output terminal of CMOS inverter 8. The source of transistor T15 is connected to the negative power supply of −10 V.

A pulse having a peak value of 5 V is applied to the input terminals of CMOS inverters 7 and 8. A positive voltage of +3 V (or +5 V) is applied to the source of transistor T10. A negative voltage of −10 V is applied to the source of transistor T13.

Figure 5:
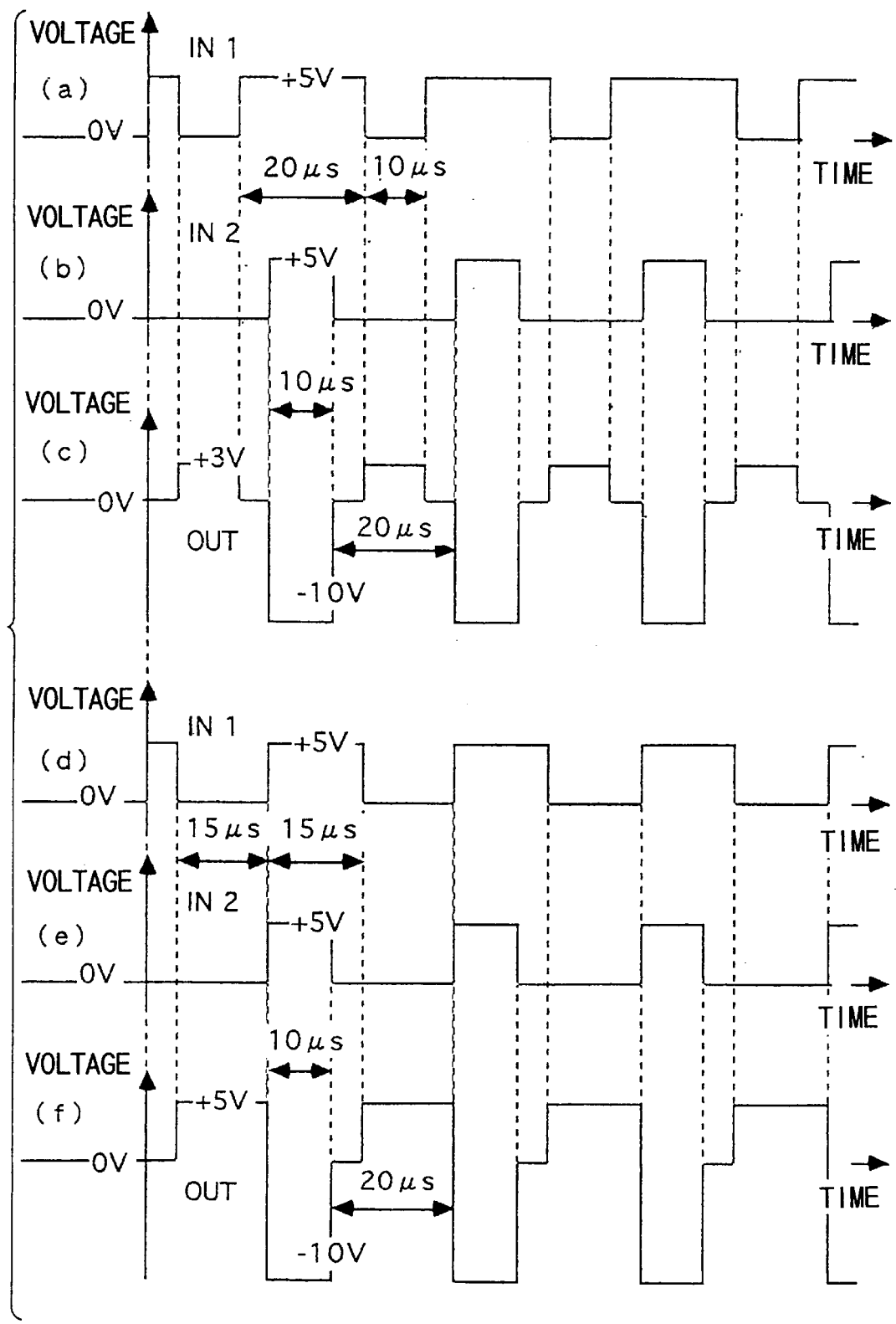
FIG. 5 is a view for explaining two examples of the circuit operation of a word line driving pulse generation circuit (level shifter) used in the device shown in FIG. 4.

Assuming that the positive power supply voltage of CMOS inverter 7 is +3 V, when word line driving signals WDSIN1 and WDSIN2 as shown in FIGS. 5(a) and 5(b) are input to word line driving pulse generation circuit 2a in FIG. 4, word line driving pulse output WDPOUT as shown in FIG. 5(c) is obtained.

Assuming that the positive power supply voltage of CMOS inverter 7 is +5 V, when word line driving signals WDSIN1 and WDSIN2 as shown in FIGS. 5(d) and 5(e) are input to word line driving pulse generation circuit 2a in FIG. 4, word line driving pulse output WDPOUT as shown in FIG. 5(f) is obtained.

To indicate a lot of variations, the waveform of pulse WDPOUT in FIG. 5(f) is changed from that in FIG. 5(c).

When word line driving pulse output WDPOUT in FIG. 5(c) is applied to memory cell transistors Ma1 and Ma2/Mb1 and Mb2 in FIG. 4, threshold voltage VTH of each memory cell transistor can converge to a value corresponding to pulse WDPOUT of +3 V while gradually extracting electrons from the floating gate of each memory cell transistor with pulse WDPOUT of −10 V.

When word line driving pulse output WDPOUT in FIG. 5(f) is applied to memory cell transistors Ma1 and Ma2/Mb1 and Mb2 in FIG. 4, threshold voltage VTH of each memory cell transistor can converge to a value corresponding to pulse WDPOUT of +5 V while gradually extracting electrons from the floating gate of each memory cell transistor with pulse WDPOUT of −10 V.

The influence observed when a large leakage of charges precharged in sub-bit line BLsa1 is caused due to leakage current component equivalent resistance Ro shown in FIG. 3B will be described below.

The leakage current of the sub-bit line is considered to be caused by an interdrain tunnel current generated when the gate voltage of the memory cell transistor is negative, or a crystal defect in the periphery of the drain diffusion layer. Particularly, the former is a main factor.

Figure 6:
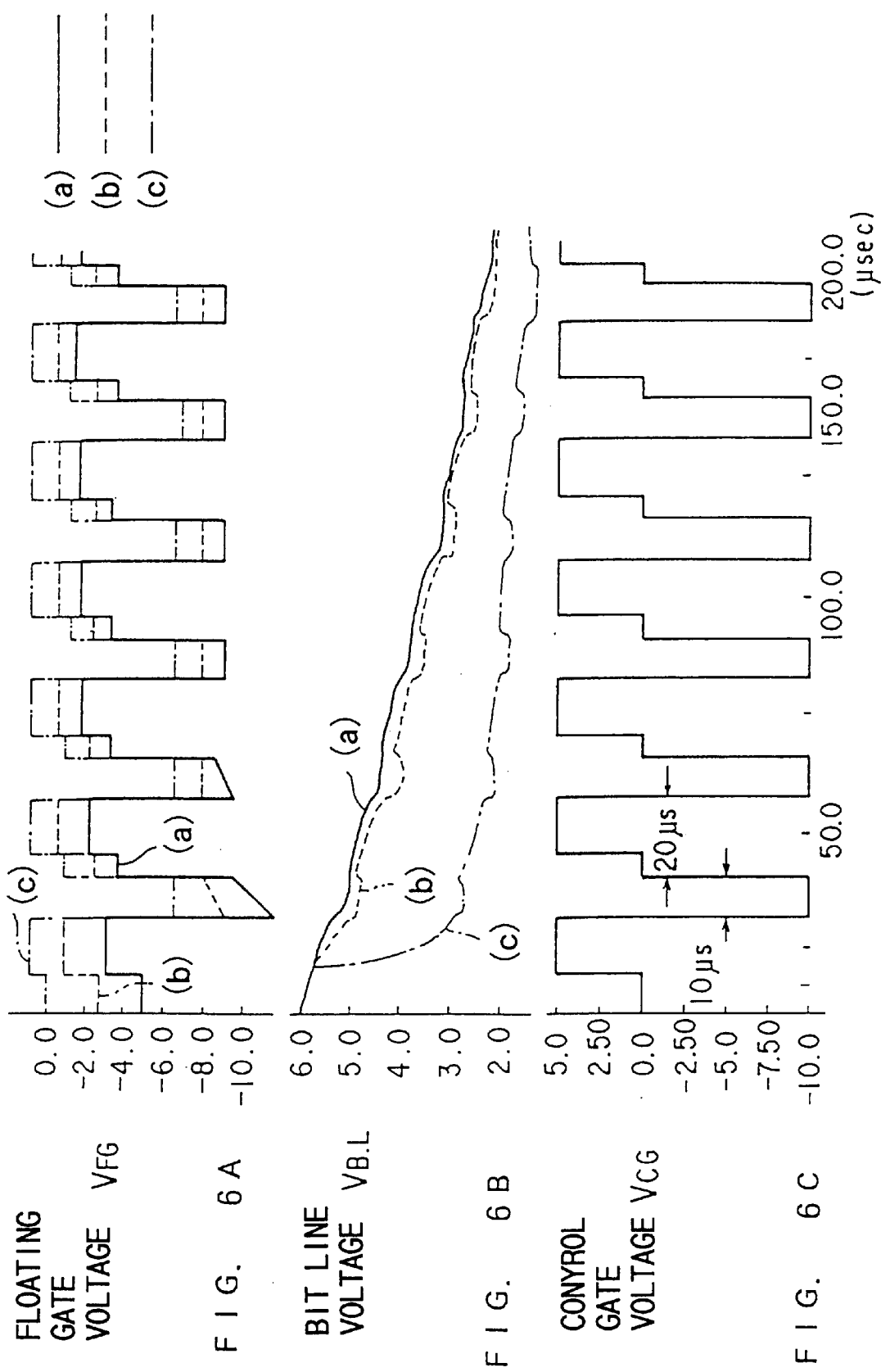
FIGS. 6A, 6B, and 6C are views for explaining the operation of a memory cell constituting the nonvolatile semiconductor memory device shown in FIG. 4 when the word line driving pulse generation circuit (level shifter) in FIG. 4 is operated with the waveform in FIG. 5.

Assume that word line driving pulse generation circuit 2a in FIG. 4 is operated with the waveforms shown in FIGS. 5(d) to 5(f). FIG. 6A shows voltage waveform VFG of the floating gate of the MOS transistor constituting each memory cell. FIG. 6B shows voltage change VBL of the sub-bit line connected to this MOS transistor. FIG. 6C shows voltage waveform VCG of the control gate of this MOS transistor.

In FIGS. 6A and 6B, assume that (a) corresponds to memory cell transistor Ma1 or the like in FIG. 4, (b) corresponds to memory cell transistor Mb1 or the like in FIG. 4, and (c) corresponds to a memory cell transistor connected to a third sub-bit line (not shown).

When the value of equivalent resistor Ro shown in FIG. 3B is small, i.e., when the leakage current (or leaked current) of the sub-bit line is large, floating gate voltage VFG can hardly converge to a desired value. FIG. 6A shows the waveform in this case.

More specifically, as shown in FIG. 6C, when a pulse whose peak value oscillates from 5 V to −10 V is applied to the control gate of the memory cell transistor to erase the nonvolatile memory cell transistor, floating gate voltage VFG oscillates in accordance with the amplitude of the pulse applied to the control gate electrode, as shown in FIG. 6A. In this process, sub-bit line voltages VBL connected to nonvolatile memory cell transistors (a), (b), and (c), respectively, abruptly decrease (at different change rates), as shown in FIG. 6B, because of the leakage current of the sub-bit line (leakage current flowing through resistance Ro). However, when the sub-bit line potential decreases too fast, nonvolatile memory cell transistors (a), (b), and (c) whose values of floating gate voltages VFG are different can hardly converge to predetermined threshold voltage VTH.

When the embodiment shown in FIG. 3B is employed, the decrease in sub-bit line voltage as shown in FIG. 6B can be prevented by the intermittent ON operation of bit line selection transistor Tsa1. Therefore, threshold voltage VTH (corresponding to floating gate voltage VFG) of the memory cell transistor can reliably converge to the desired value.

In the embodiment shown in FIGS. 3A and 3B, charges which escape through leakage current component equivalent resistance Ro are compensated by the intermittent ON operation of the leakage current compensation circuit (Tsa1). For this reason, while bit line selection transistor Tsa1 is turned off, charges accumulated in sub-bit line BLsa1 can be held for a long time. Therefore, when bit line selection transistor Tsa1 is used as a transfer gate, and equivalent capacitance Co of sub-bit line BLsa1 is used as an information memory capacitance, a DRAM arrangement capable of setting a long refresh period can be realized.

In the embodiment shown in FIGS. 3A and 3B, the high-potential information of sub-bit line BLsa1 can be maintained even when a leakage current flows. In addition, for the low-potential information of sub-bit line BLsa1, the information can be maintained by keeping transistor Tsa1 in the OFF state.

However, if the pulse shown in FIG. 6C is kept applied to the gate of, e.g., memory cell transistor (c) even after the threshold value of memory cell transistor (c) converges to threshold voltage VTH (after the write operation is completed), this transistor (c) is repeatedly turned on/off. For this reason, a potential variation synchronized with the pulse in FIG. 6C (e.g., a pulse obtained by slightly increasing the amplitude of waveform (c) in FIG. 6B) appears in voltage VBL of the sub-bit line (BLsa1/BLsa2) (a detailed example of the potential variation waveform is indicated by waveform (b) in FIG. 9B of the aforementioned Japanese Patent Application No. 6-222734).

This potential variation is removed by SRAM bit 30 (30a or 30b) shown in embodiments in FIG. 10 and subsequent drawings (to be described later in detail).

Figure 8:
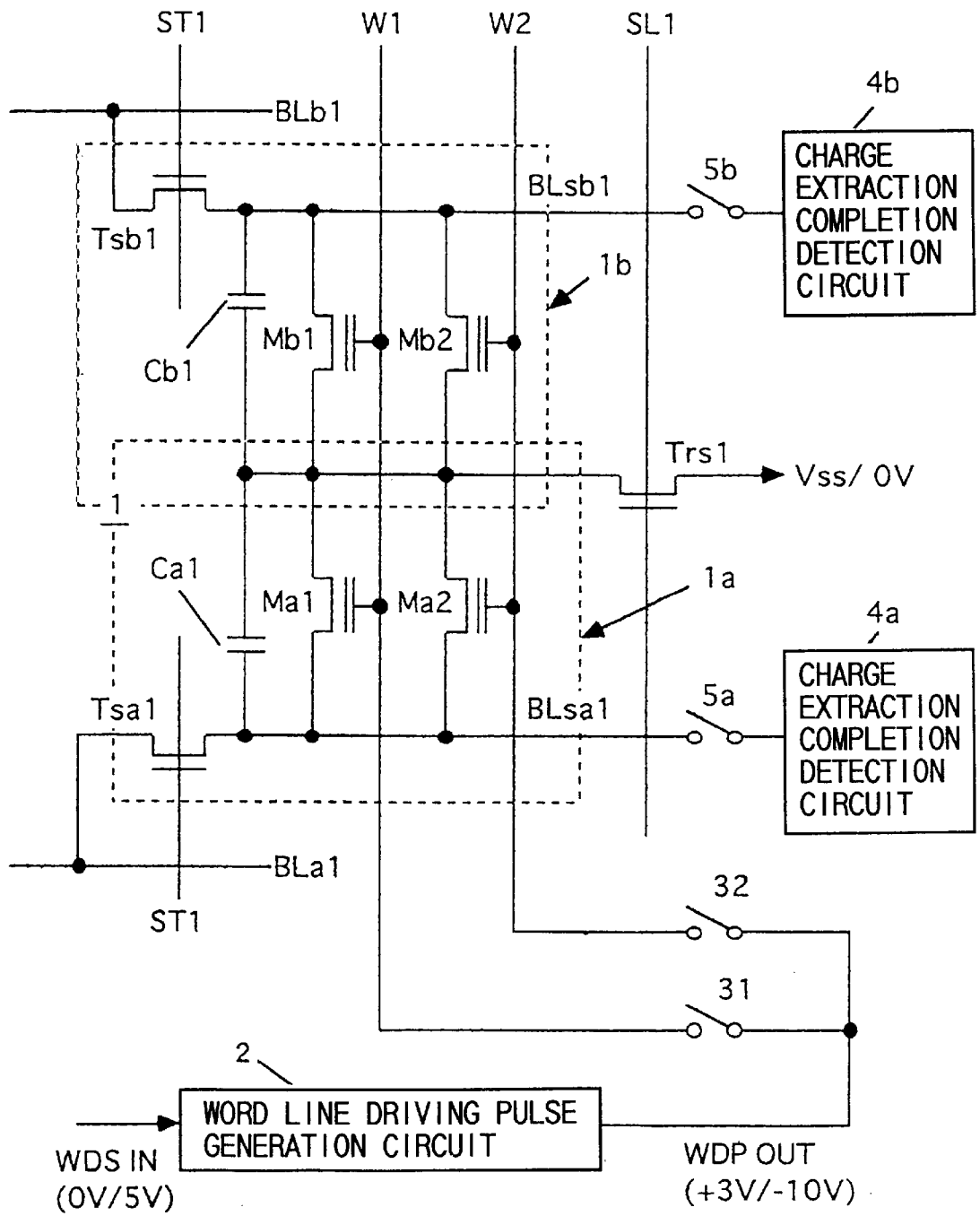
FIG. 8 is a circuit diagram for explaining the arrangement of a nonvolatile semiconductor memory device according to the third embodiment of the present invention.

FIG. 8 shows the arrangement of a nonvolatile semiconductor memory device according to the third embodiment of the present invention. This also corresponds to a modification of the embodiment shown in FIG. 1 or 4.

The number of circuits of word line switch circuit 3 in FIG. 1 may be equal to the number of memory cell transistors Ma1 and Ma2 (Mb1 and Mb2) which constitute memory cell block 1a (1b), as shown in FIG. 8. If memory cell block 1a is constituted by 1,024 memory cell transistors Ma1 to Ma1024, 1,024 word line switch circuits are prepared. Alternatively, word line switch circuit 3 is constituted by a multiplexer which sequentially connects an output from word line driving pulse generation circuit 2 to 1,024 word lines W1 to W1024.

Referring to FIG. 8, when all word line switch circuits 31 and 32 are simultaneously turned on to simultaneously connect all the word lines to the output of word line driving pulse generation circuit 2, data in the memory cell transistors in all the memory cell blocks can be simultaneously erased (this is the full erase operation of a flash EEPROM).

On the other hand, when word line switch circuits 31 and 32 are turned on one by one to connect a specific word line to the output of word line driving pulse generation circuit 2, data in only a specific memory cell transistor in each memory cell block can be erased (bit unit erase operation).

Figure 9:
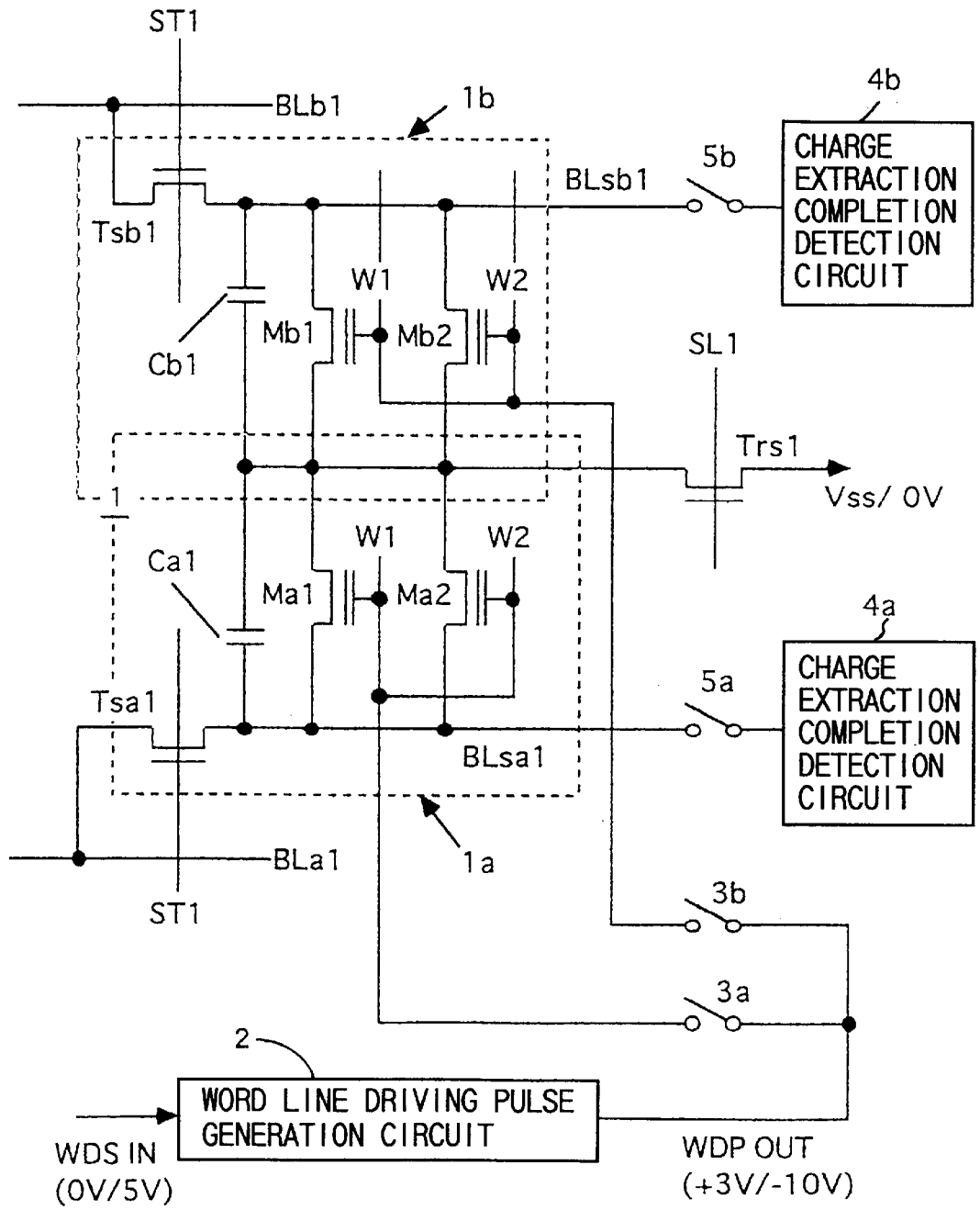
FIG. 9 is a circuit diagram for explaining the arrangement of a nonvolatile semiconductor memory device according to the fourth embodiment of the present invention.

FIG. 9 shows the arrangement of a nonvolatile semiconductor memory device according to the fourth embodiment of the present invention. This also corresponds to a modification of the embodiment shown in FIG. 1 or 4.

The number of circuits of word line switch circuit 3 in FIG. 1 may be equal to the number of memory cell blocks 1a (1b), as shown in FIG. 9. If memory cell blocks comprise 512 blocks, 512 word line switch circuits are prepared. Alternatively, word line switch circuit 3 is constituted by a multiplexer which sequentially connects an output from word line driving pulse generation circuit 2 to 512 block unit word lines.

Referring to FIG. 9, when all word line switch circuits 3a and 3b are simultaneously turned on to simultaneously connect all the word lines to the output of word line driving pulse generation circuit 2, data in the memory cell transistors in all the memory cell blocks can be simultaneously erased (this is the full erase operation of a flash EEPROM).

On the other hand, when word line switch circuits 3a and 3b are turned on one by one to connect the word line of a specific memory block to the output of word line driving pulse generation circuit 2, data in all memory cell transistors in each memory cell block can be erased in units of blocks (block unit erase operation).

FIGS. 10A to 10C are views for explaining a nonvolatile semiconductor memory device according to the fifth embodiment of the present invention. FIG. 10A shows the main part of the arrangement. FIG. 10B shows the waveforms of main signals. FIG. 10C shows part of the circuit.

Referring to FIG. 10A, SRAM bit 30a is connected to sub-bit line BLsa1 through SRAM bit connection transistor Tga. SRAM bit 30b is connected to sub-bit line BLsb1 through SRAM bit connection transistor Tgb.

FIG. 10C shows the main circuit arrangement on sub-bit line BLsa1, which is extracted from the circuit shown in FIG. 10A. More specifically, sub-bit line BLsa1 is selectively connected to main bit line BLa1 through bit line selection transistor Tsa1. Memory cell transistor Ma1 is connected to sub-bit line BLsa1. Capacitance Co and leakage current component equivalent resistance Ro are equivalently connected to sub-bit line BLsa1. SRAM bit 30a is connected to sub-bit line BLsa1 through SRAM bit connection transistor Tga.

The circuit shown in FIG. 10C operates in the following manner. Addressing is performed for a data write operation in memory cell transistor Ma1, and sub-bit line BLsa1 is precharged to the potential (+5 V) of main bit line BLa1 (before time t1). Thereafter, at time t1, a signal shown at the uppermost stage of FIG. 10B is applied to the gate of connection transistor Tga. The drain and source of transistor Tga are rendered conductive, so that SRAM bit 30a is connected to sub-bit line BLsa1.

Signal ST1 (the second upper stage of FIG. 10B) which is applied to the gate of bit line selection transistor Tsa1 to precharge sub-bit line BLsa1 is decreased to 0 V in its level (time t2). Sub-bit line BLsa1 is disconnected from main bit line BLa1 and set in a floating state while being charged to the precharged potential.

Thereafter, word line driving pulse output WDPOUT (the lowermost stage of FIG. 10B) is applied to the control gate of memory cell transistor Ma1, and transistor Ma1 is turned on (time t3). At this time, the potential of sub-bit line BLsa1 changes in the direction of 0 V. Since SRAM bit connection transistor Tga is in the ON state, SRAM bit 30a can detect this change in sub-bit line potential.

When the change in sub-bit line potential is detected, SRAM bit 30 latches the sub-bit line potential (0 V) immediately after the change. The potential of sub-bit line BLsa1 is clamped to the latch level (stored content; 0 V) of SRAM bit 30a through connection transistor Tga in the ON state (third upper stage of FIG. 10B).

As a result, even when memory cell transistor Ma1 is repeatedly turned on/off by continuously applying word line driving pulse output WDPOUT (e.g., continuously applying 10 pulses) after time t3, the potential variation of sub-bit line BLsa1 in synchronism with word line driving pulse output WDPOUT is almost eliminated because the sub-bit line potential is clamped to the latch level (0 V).

When SRAM bit 30a/30b in FIG. 10A is connected to sub-bit line BLsa1/BLsb1 of the circuit of the embodiment shown in FIG. 1, 4, 8, or 9, the potential variation of the sub-bit line of each of these embodiments is prevented.

Figure 11:
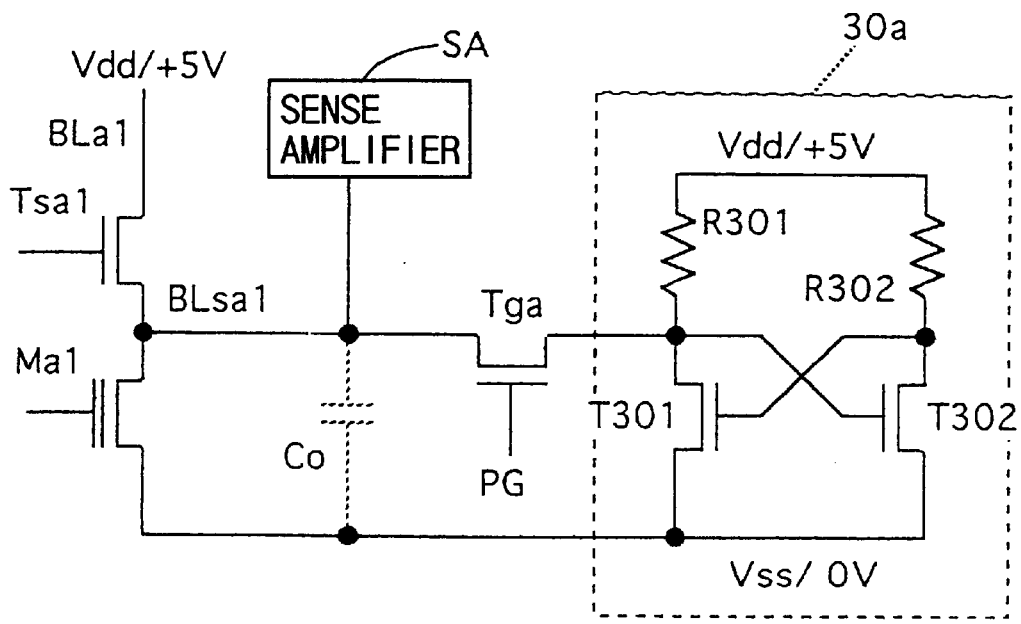
FIG. 11 is a circuit diagram showing a detailed example of an SRAM bit shown in the embodiment in FIG. 10.

FIG. 11 shows a detailed example of SRAM bit 30a in FIG. 10A. This circuit 30a includes a flip-flop circuit constituted by cross connection of n-channel transistor T301 having drain load resistor R301 and n-channel transistor T302 having drain load resistor R302. Normally, transistor T301 (conductance: small) is in an OFF state, and transistor T302 (conductance: large) is in an ON state.

The read operation of the circuit shown in FIG. 11 is as follows. When connection transistor Tga is turned on, sub-bit line BLsa1 is connected to the gate of transistor T302. If the sub-bit line potential is +5 V, transistor T302 is kept in the ON state, and the flip-flop circuit state does not change. That is, the sub-bit line potential of +5 V is not latched to circuit 30a.

When connection transistor Tga is turned on, sub-bit line BLsa1 is connected to the gate of transistor T302. If the sub-bit line potential is 0 V, transistor T302 is turned off, and transistor T301 is turned on instead. The flip-flop circuit state changes, and the sub-bit line potential of 0 V is latched to circuit 30a (i.e., the sub-bit line potential is clamped to the drain potential of transistor T301 in the ON state).

The potential of sub-bit line BLsa1 is detected by sense amplifier SA, and memory cell data corresponding to this potential is read out by sense amplifier SA.

The conductance of transistor T301 is different from that of transistor T302. Therefore, when SRAM bit connection transistor Tga is turned off, the original flip-flop state is restored (transistor T301 is OFF, and transistor T302 is ON).

Figure 12:
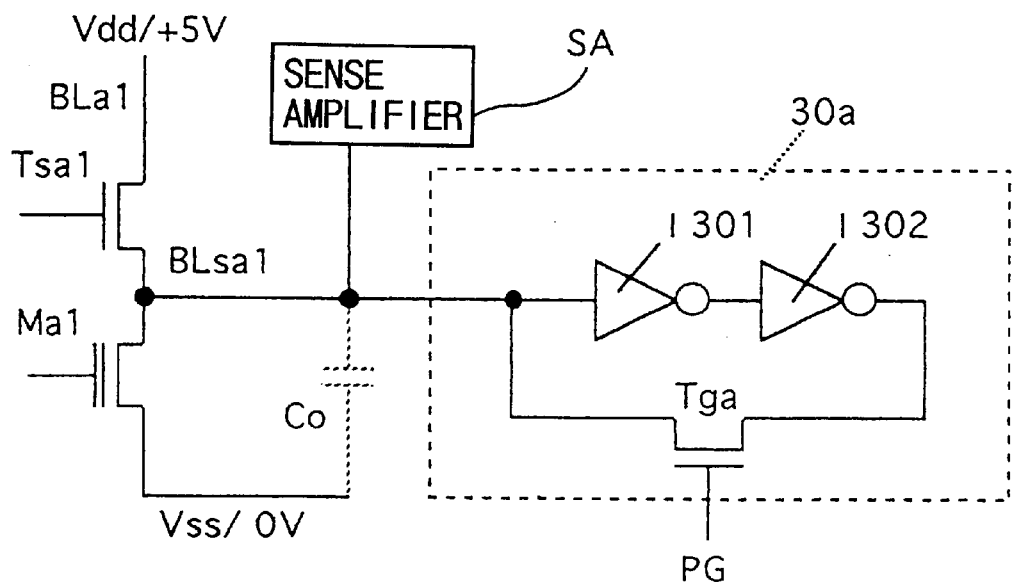
FIG. 12 is a circuit diagram showing another detailed example of the SRAM bit shown in the embodiment in FIG. 10.

FIG. 12 shows another example of SRAM bit 30a in FIG. 10A. This circuit 30a comprises series-connected two inverters I310 and I302, and transistor Tga which selectively and positively feeds back an output from inverter I302 to the input of inverter I301.

In the circuit shown in FIG. 12, when sub-bit line BLsa1 is at +5 V in the ON state of transistor Tga, the output from inverter I302 is also at +5 V. This output of +5 V is fed back to sub-bit line BLsa1 through transistor Tga in the ON state, so that the potential of sub-bit line BLsa1 is clamped (latched) to +5 V.

On the other hand, when sub-bit line BLsa1 is at 0 V in the ON state of transistor Tga, the output from inverter I302 is also at 0 V. This output of 0 V is fed back to sub-bit line BLsa1 through transistor Tga in the ON state, so that the potential of sub-bit line BLsa1 is clamped (latched) to 0 V. With this 0 V clamp, the potential variation of sub-bit line BLsa1 is suppressed.

The potential of sub-bit line BLsa1 is detected by sense amplifier SA, and memory cell data corresponding to this potential is read out by sense amplifier SA.

FIG. 13 is a circuit diagram for explaining the arrangement of a nonvolatile semiconductor memory device according to the sixth embodiment of the present invention. N SRAM bits (flip-flops) 301 to 30n are connected to n bit lines BL1 to BLn, respectively. These SRAM bits constitute SRAM memory block 300.

The drains of m memory cell transistors M11 to M1m are connected to bit line BL1 of SRAM bit 301. Similarly, the drains of m memory cell transistors M21 to M2m are connected to bit line BL2 of SRAM bit 302. The drains of m memory cell transistors Mn1 to Mnm are connected to bit line BLn of SRAM bit 30n.

The gates of n memory cell transistors M11 to Mn1 are connected to word line W1. The gates of n memory cell transistors M12 to Mn2 are connected to word line W2. Similarly, the gates of n memory cell transistors M13 to Mn3 are connected to word line W3. The gates of n memory cell transistors M1m to Mnm are connected to word line Wm.

In the above arrangement, the n×m memory cell transistors (each memory cell transistor has the same structure as that of transistor Ma1 shown in FIG. 10A) form the flash memory cell array of this embodiment. For example, when n=512, and m=8, the memory cell array shown in FIG. 13 is a flash memory cell block of 512 bytes. When 1,000 blocks are arranged, a nonvolatile semiconductor memory device of 512 kbytes is realized.

Although several hundreds microseconds are taken to write data in each of memory cell transistors M11 to M1m which are connected to bit line BL1 in FIG. 13, only several tens nanoseconds are necessary to write data in SRAM bit 301 connected to bit line BL1. Once predetermined data ("0"/"1") is written in SRAM bit 301 in a short time, the potential of bit line BL1 can be maintained at the potential of the data written in SRAM bit 301. This data potential does not change even when a small leakage current flows to bit line BL1.

If word line W1 goes to high level to select cell M11 while the potential of bit line BL1 is maintained at the potential corresponding to the stored data, a positive/negative oscillation pulse (word line driving signal WDPOUT) as shown at the lower stage of FIG. 10B is applied to the gate of the transistor (Ma1 in FIG. 10A or 10C) constituting cell M11. When several to 10 pulses are repeatedly applied, the potential of bit line BL1 (data stored in SRAM bit 301) is written in the floating gate of transistor M11 as nonvolatile information. The data write operation to the floating gate of another memory cell transistor is performed in a similar manner.

If the arrangement in FIG. 13 has 512 bits×m (m is an integer) memory cell blocks, 512-bit data is simultaneously written from an external circuit (not shown) in SRAM bits 301 to 30n (n=512) (the time required for the write operation is normally several tens nanoseconds or less).

Thereafter, the potentials of bit lines BL1 to BLn, which are determined on the basis of data written in SRAM bits 301 to 30n, are respectively written in the specific one of memory cell transistors M11 to Mnm, which is selected by word lines W1 to Wm (the time required for the write operation is normally several hundreds microseconds or less). After this write operation is completed, the contents in SRAM bits 301 to 30n may be erased.

With the above arrangement, a flash memory capable of performing a high-speed write operation can be obtained.

Figure 14:
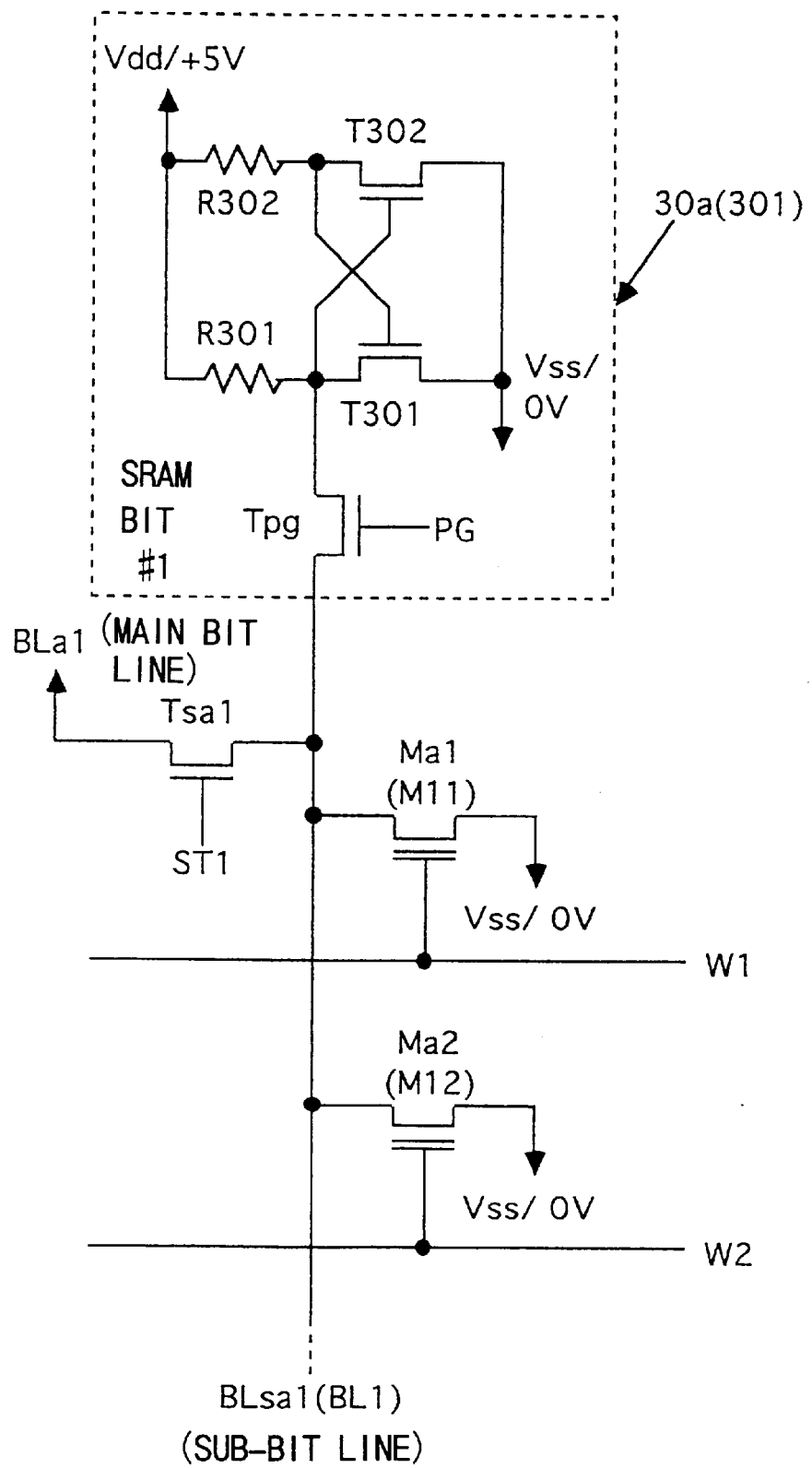
FIG. 14 is a circuit diagram showing a detailed example of an SRAM bit circuit shown in the embodiment of FIG. 13.

FIG. 14 shows a detailed example of the SRAM bit.

SRAM bit 30a in FIG. 14 includes the same circuit arrangement as that of flip-flop 30a in FIG. 11. In FIG. 14, however, the flip-flop circuit includes pass gate (connection transistor) Tpg, thereby constituting one cell of SRAM bit 301.

Figure 16:
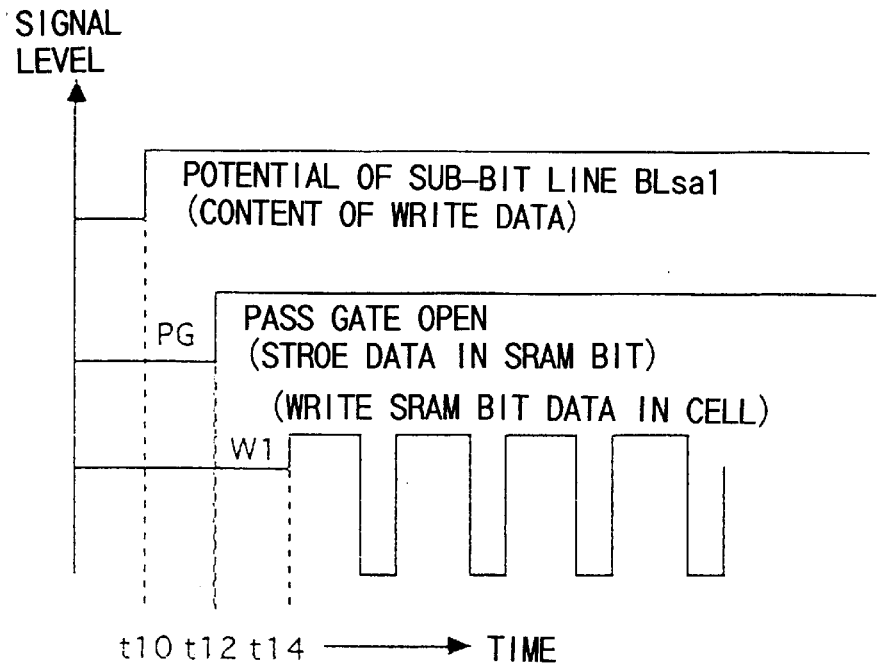
FIG. 16 is a timing chart for explaining the circuit operation of the SRAM bit circuit shown in FIG. 14.

FIG. 16 is a timing chart for explaining the circuit operation of SRAM bit 30a/301 shown in FIG. 14. After time t10, write data (0 or 1) from an external circuit (not shown) is supplied to sub-bit line BLsa1. At time t12, pass gate signal PG is applied to the gate of transistor Tpg, and transistor Tpg is turned on. Data corresponding to the potential of sub-bit line BLsa1 is stored in flip-flop type SRAM bit 30a. While transistor Tpg is ON, the potential of sub-bit line BLsa1 is fixed at a potential (e.g., 0 V when transistor T301 is ON) corresponding to the data stored in SRAM bit 30a and does not vary.

Thereafter, at time t14, a positive/negative oscillation pulse (word line driving signal) is applied to the gate of memory cell transistor Ma1 through word line W1. Data corresponding to the potential of sub-bit line BLsa1 (i.e., the content stored in SRAM bit 30a) is written in the floating gate of transistor Ma1.

In FIG. 16, about several tens nanoseconds suffice from time t10 to time t12 and time t12 to time t14, respectively.

Figure 15:
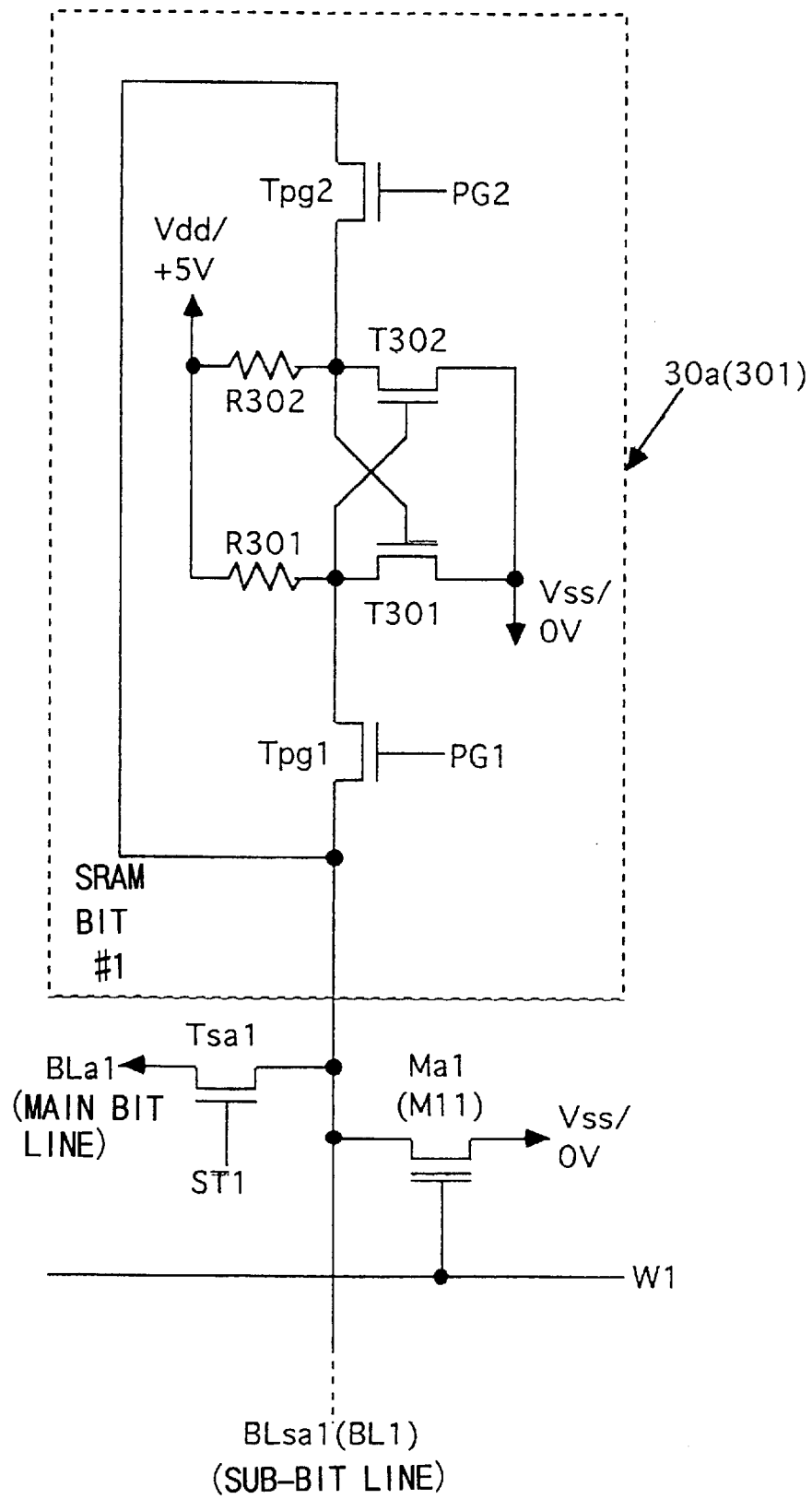
FIG. 15 is a circuit diagram showing another detailed example of the SRAM bit circuit shown in the embodiment of FIG. 13.

FIG. 15 shows another detailed example of the SRAM bit. In SRAM bit 301 in FIG. 14, only one pass gate Tpg is provided to one output of the flip-flop. In SRAM bit 301 in FIG. 15, however, two pass gates Tpg1 and Tpg2 are provided to both outputs of the flip-flop.

Figure 17:
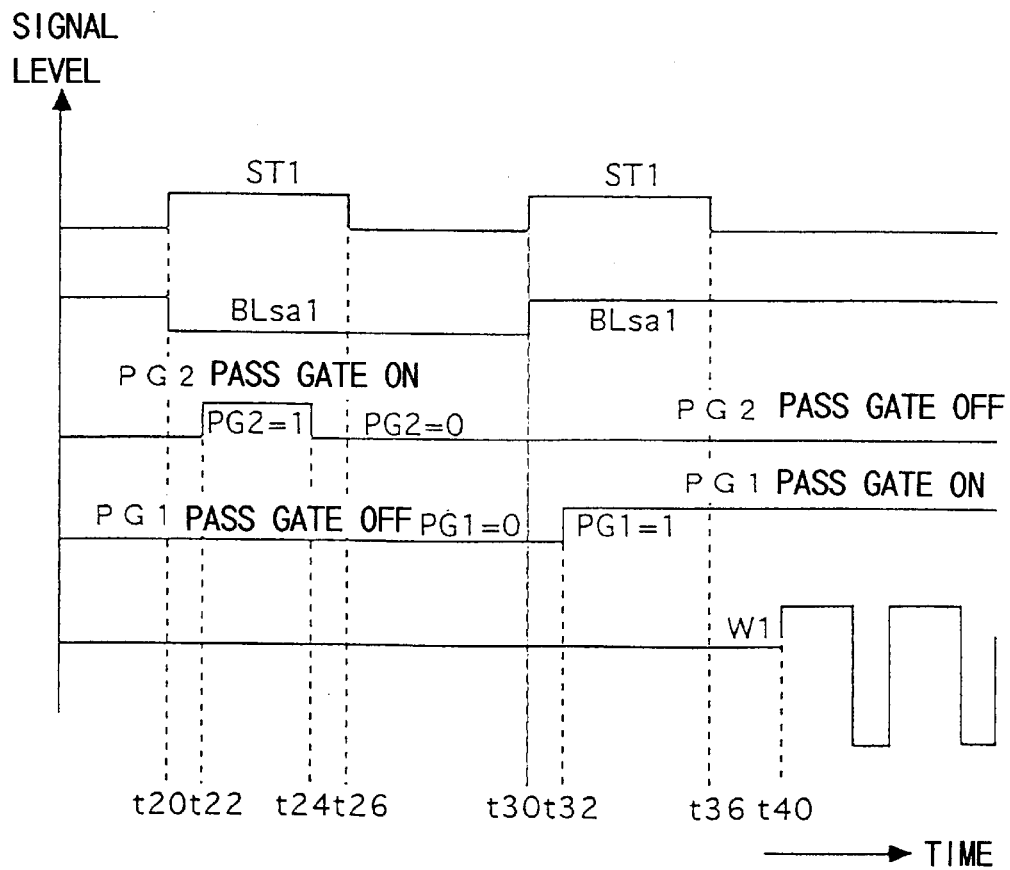
FIG. 17 is a timing chart for explaining the circuit operation of the SRAM bit circuit shown in FIG. 15.

FIG. 17 is a timing chart for explaining the circuit operation of SRAM bit 30a/301 shown in FIG. 15. After time t20, write data ("0") from an external circuit (not shown) is supplied to sub-bit line BLsa1 through transistor Tsa1. At time t22, when pass gate signal PG2 is applied to the gate of transistor Tpg2, the transistor Tpg2 is turned on. Data corresponding to the potential of sub-bit line BLsa1 is stored in flip-flop type SRAM bit 30a, and subsequently, at time t24, transistor Tpg2 is turned off.

Thereafter, assume that write data ("1") from an external circuit (not shown) is supplied to sub-bit line BLsa1 through transistor Tsa1 (time t30). When pass gate signal PG1 is generated (time t32), transistor Tpg1 is turned on. While transistor Tpg1 is ON, the potential of sub-bit line BLsa1 is fixed at a potential (e.g., 5 V when transistor T301 is OFF) corresponding to the data stored in SRAM bit 30a and does not vary.

Thereafter, a similar operation as in FIG. 16 is performed. More specifically, when a positive/negative oscillation pulse (word line driving signal) is applied to the gate of memory cell transistor Ma1 through word line W1, data corresponding to the potential of sub-bit line BLsa1 (i.e., the contents stored in SRAM bit 30a) is written in the floating gate of transistor Ma1.

Several tens nanoseconds or less are sufficient for periods of time t20 to t26, t30 to t36, and t36 to t40 in FIG, 17, respectively.

Figure 18:
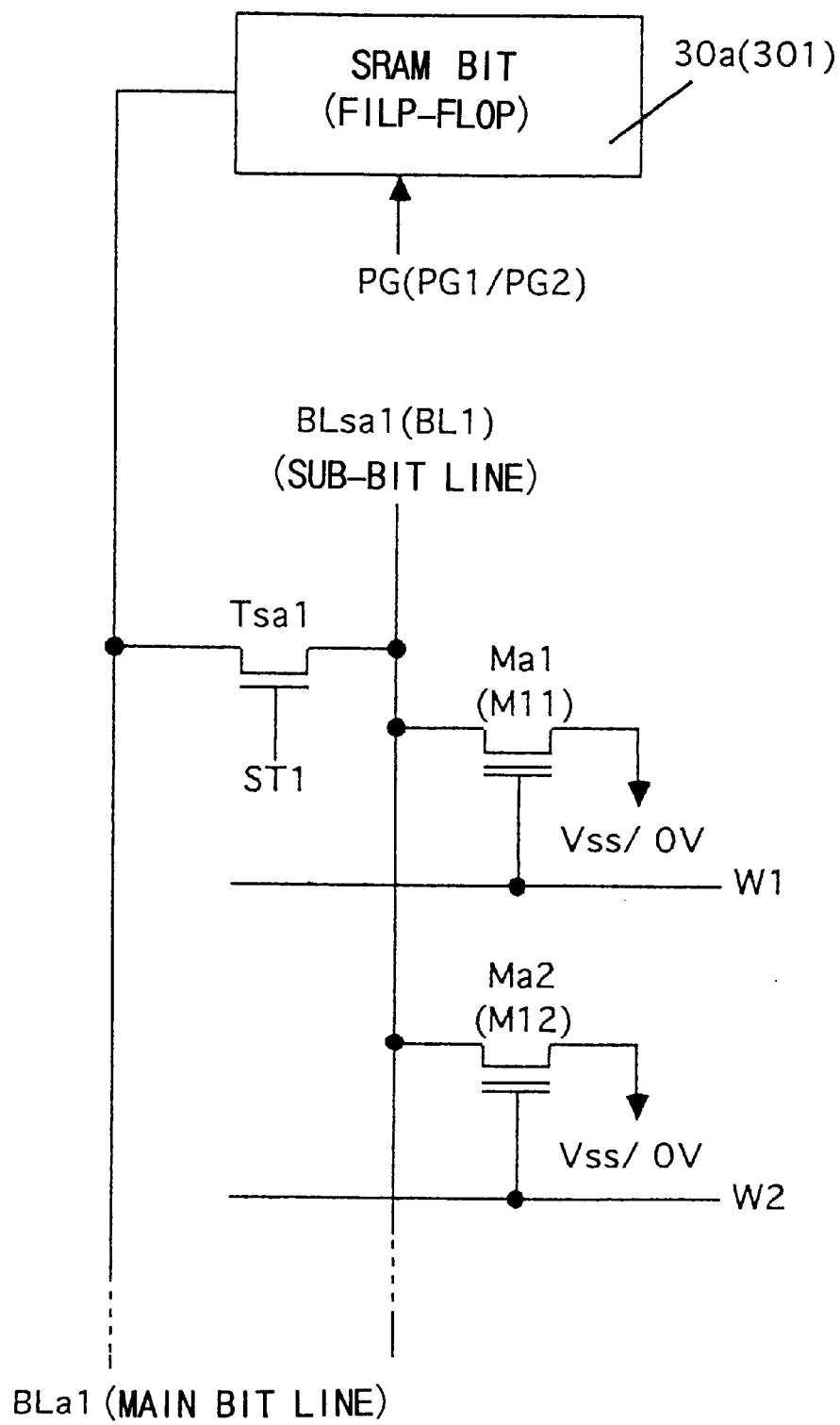
FIG. 18 is a circuit diagram showing a modification of FIG. 14 or FIG. 15, in which an SRAM bit circuit is provided on a main bit line side.

FIG. 18 shows a modification of FIG. 14 or 15, in which SRAM bit 30a is provided on main bit line BLa1 side. In the circuit shown in FIG. 18, gate signal ST1 is kept at high level until write data temporarily stored in the SRAM bit is completely written in a desired cell (e.g., Ma1). Except this point, the embodiment shown in FIG. 18 is basically the same as that in FIG. 14 or 15.

Figure 19:
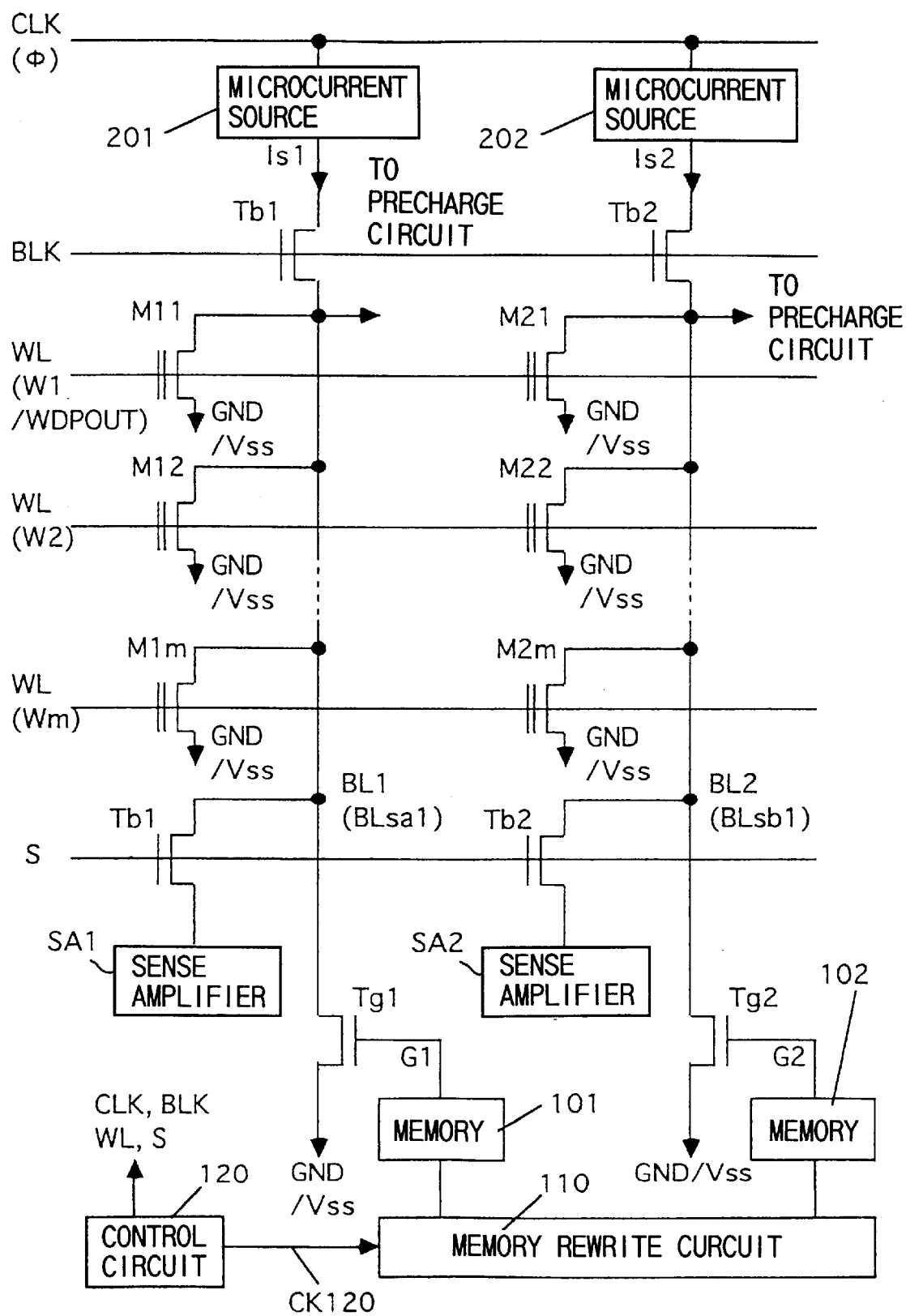
FIG. 19 is a circuit diagram for explaining the arrangement of a nonvolatile semiconductor memory device according to the seventh embodiment of the present invention.

FIG. 19 is a circuit diagram for explaining the arrangement of a nonvolatile semiconductor memory device according to the seventh embodiment of the present invention.

One end of bit line BL1 (or BLsa1) is connected to small current source 201 through n-channel transistor (transfer gate) Tb1. The other end of bit line BL1 is connected to sense amplifier SA1 through n-channel transistor (transfer gate) Ts1 and also connected to negative power supply Vss/0 V circuit (ground circuit GND) through n-channel transistor Tg1.

The drains of a lot of nonvolatile memory cell transistors (n-channel MOS transistors each having a control gate and a floating gate) M11 to M1m which constitute the first column of a memory cell array are connected to bit line BL1. The sources of memory cell transistors M11 to M1m are connected to negative power supply Vss/0 V circuit (ground circuit GND).

Similarly, one terminal of bit line BL2 (or BLsb1) is connected to small current source 202 through n-channel transistor (transfer gate) Tb2. The other terminal of bit line BL2 is connected to sense amplifier SA2 through n-channel transistor (transfer gate) Ts2 and also connected to negative power supply Vss/0 V circuit (ground circuit GND) through n-channel transistor Tg2. The drains of a lot of nonvolatile memory cell transistors M21 to M2m which constitute the second column of the memory cell array are connected to bit line BL2. The sources of memory cell transistors M21 to M2m are connected to negative power supply Vss.

Each of the remaining memory cell columns (none are shown) also has the same arrangement as described above. The respective blocks of the memory cell array are constituted by gate circuits (word lines) WL, i.e., W1 to Wm of memory cell transistors M11 to Mn1, M12 to Mn2, ..., M1m to Mnm.

Each of small current sources 201, 202, ... can be constituted by a constant-current circuit or a voltage generation circuit (e.g., a charge pump) having a high internal impedance.

Small current sources 201, 202, ... of this embodiment are operated by external clock CLK (m) to supply small currents Is1, Is2, ... each having a magnitude corresponding to the clock frequency or duty ratio to transistors Tb1, Tb2, ..., respectively. Transistors Tb1, Tb2, ... are controlled to be opened/closed (ON/OFF-controlled) by gate signal BLK. When signal BLK goes to high level, these transistors are rendered conductive (turned on), so that small currents Is1, Is2, ... from small current sources 201, 202, ... can be supplied to bit lines BL1, BL2, ..., respectively.

Transistors Ts1, Ts2, ... are controlled to be opened/closed (ON/OFF-controlled) by gate signal S. When signal S goes to high level, these transistors are rendered conductive (turned on), so that bit lines BL1, BL2, ... are connected to sense amplifiers SA1, SA2, ..., respectively. When sense amplifier SA1 is connected to bit line BL1 through transistor Ts1, data stored in memory cell transistor M11 (corresponding to the potential of bit-line BL1) selected by word line W1 is read out by sense amplifier SA1. A similar read operation is performed for the remaining memory cells.

External clock CLK (φ), gate signal BLK, word line driving signal WL, gate signal S, and the like are generated from control circuit 120 at predetermined timings.

N-channel transistors Tg1, Tg2, ... receive data G1, G2, ... from memories 101, 102, ... and temporarily store the data, respectively. When all the contents of data G1, G2, ... are at low level, all transistors Tg1, Tg2, ... are in an OFF state. Since the current paths from small current sources 201, 202, ... to ground circuit GND are shielded by transistors Tg1, Tg2, ..., respectively, small currents Is1, Is2, ... do not flow even when transistors Tb1, Tb2, ... are ON because of BLK=H.

On the other hand, when all the contents of data G1, G2, ... are at high level, all transistors Tg1, Tg2, ... are in a weak ON state (not in a short-circuit state but in an ON state with a high impedance). If transistors Tb1, Tb2, ... are ON because of BLK=H, small currents Is1, Is2, ... flow from small current sources 201, 202, ... to ground circuit GND through transistors Tg1, Tg2, ..., respectively.

For example, when only data G1 is at high level, and all the remaining data G2, ... are at low level, only transistor Tg1 is in a weak ON state, and all the remaining transistors Tg2, ... are turned off. In this case, if transistors Tb1, Tb2, ... are ON because of BLK=H, small current Is1 flows from small current source 201 to ground circuit GND only through transistor Tg1.

As described above, bit lines BL1, BL2, ... to which small currents Is1, Is2, ... flow, respectively, can be arbitrarily determined in accordance with the contents of memories 101, 102, ... (data G1, G2 .....)

Each of memories 101, 102, ... are normally constituted by a static memory circuit such as a flip-flop. However, the memory can be constituted by a dynamic memory circuit such as a DRAM.

In an arrangement to which the present invention is not applied, if the potential of bit line BL1 changes (decreases) with the elapse of time due to a leakage current or the like while the write operation in memory cell transistors M11 to M1m connected to bit line BL1 is performed, the write operation (or the erase operation) in memory cell transistors M11 to M1m may not be properly performed in some cases.

Small current source 201 is provided to cancel the change in potential of bit line BL1 caused due to the leakage current. More specifically, while the write operation (or the erase operation) in memory cell transistors M11 to M1m is performed, charges lost from bit line BL1 due to the leakage current or the like are supplemented with small current Is1 from small current source 201, thereby preventing the change in potential of bit line BL1, which may raise a practical problem.

Transistors (one or a plurality of transistors) of transistors Tg1, Tg2, . . . , which are to be set in a weak OFF (or ON) state, are determined on the basis of the contents (signal levels) of data G1, G2, . . . . The contents of data G1, G2, . . . must be held until the write operation (or the erase operation) is completed. For this purpose, memories 101, 102, . . . are provided as the holding means.

The contents of data G1, G2, . . . to be written in memories 101, 102, . . . , respectively, are determined by memory rewrite circuit 110. Data G1, G2, . . . are written from memory rewrite circuit 110 in memories 101, 102, . . . in synchronism with timing clock CK120 from control circuit 120.

Figure 20:
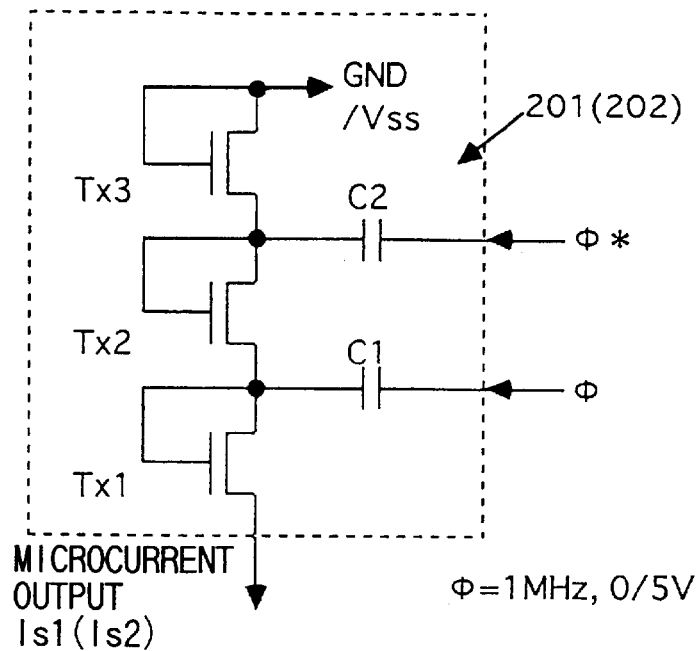
FIG. 20 is a circuit diagram showing a detailed example of a small current source shown in the embodiment in FIG. 19.

FIG. 20 is a circuit diagram showing a detailed example of each of small current sources (charge pumps) 201, 202, . . . shown in the embodiment in FIG. 19.

The gate and drain of n-channel MOS transistor Tx3 are connected to negative power supply Vss (0 V). The source of transistor Tx3 is connected to the gate and drain of n-channel MOS transistor Tx2. The source of transistor Tx2 is connected to the gate and drain of n-channel MOS transistor Tx1.

Clock $\phi$ (=CLK) is supplied to the gate/drain of transistor tx1 through capacitor C1. Inverted clock $\phi^*$ of clock $\phi$ is supplied to the gate/drain of transistor Tx2 through capacitor C2. As clock $\phi$ ($\phi^*$), a rectangular pulse having, e.g., a frequency of 1 MHz, an amplitude of 5 V, and a duty ratio of 50% is used.

In the small current source (charge pump) having the above arrangement, small current Is1 (or Is2, . . . ) is output from the source of transistor tx3 in synchronism with clock $\phi$.

Figure 21:
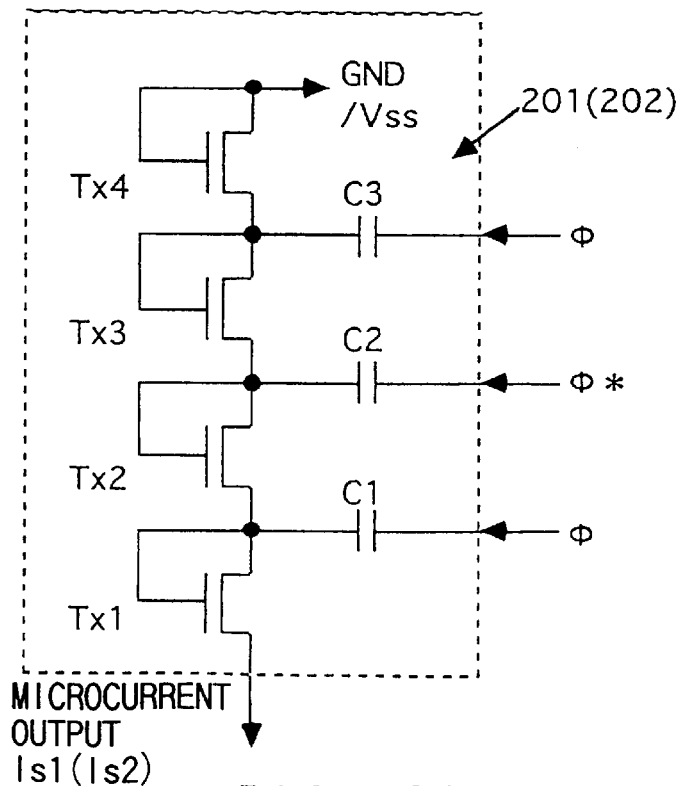
FIG. 21 is a circuit diagram showing another detailed example of the small current source shown in the embodiment in FIG. 19.

FIG. 21 is a circuit diagram showing another detailed example of each of small current sources (switched capacitors) 201, 202, . . . shown in the embodiment in FIG. 19.

The gate and drain of n-channel MOS transistor Tx4 are connected to negative power supply Vss (0 V). The source of transistor Tx4 is connected to the gate and drain of n-channel MOS transistor Tx3. The source of transistor Tx3 is connected to the gate and drain of n-channel MOS transistor Tx2. The source of transistor Tx2 is connected to the gate and drain of n-channel MOS transistor Tx1.

Clock $\phi$ (=CLK) is supplied to the gate/drain of transistor tx1 through capacitor C1. Inverted clock $\phi^*$ of clock $\phi$ is supplied to the gate/drain of transistor Tx2 through capacitor C2. Inverted clock $\phi^*$ of clock $\phi$ is supplied to the gate/drain of transistor Tx3 through capacitor C3. As clock $\phi$ ($\phi^*$), a rectangular pulse having, e.g., a frequency of 1 MHz, an amplitude of 5 V, and a duty ratio of 50% is used.

In the small current source (switched capacitor) having the above arrangement, small current Is1 (or Is2, . . . ) is output from the source of transistor tx3 in synchronism with clock $\phi$.

FIG. 22 is a timing chart for explaining the circuit operation (erase operation) of the embodiment shown in FIG. 19. When data in all memory cell transistors M11 to Mnm in FIG. 19 are to be erased at once (i.e., flashed) (or in units of blocks), data G1, G2, . . . of high level are written from memory rewrite circuit 110 in memories 101, 102, . . . , respectively (time t100). From time t100, data G1, G2, . . . . of high level are supplied from memories 101, 102, . . . . to transistors Tg1, Tg2, . . . , respectively, and transistors Tg1, Tg2, . . . are set in a weak ON state. In this state, an erase potential (e.g., +6.5 V) is applied from a precharge circuit (not shown), and bit lines BL1, BL2, . . . are precharged with this potential. At this time, a small current constantly flows from the precharge circuit to transistors Tg1, Tg2, . . . in the weak ON state. With this arrangement, even when a leakage current flows to bit lines BL1, BL2, . . . , this leakage current is canceled by the small current from the precharge circuit, so that the erase potential of these bit lines is maintained.

Within a predetermined period after this operation (time t102 to time t104), word line driving signal WL of H level is applied to the gates of all the memory cell transistors (or memory cell transistors in a specific block to be flashed), so that the contents stored in all the memory cell transistors (or memory cell transistors in a specific block to be flashed) are flashed to contents corresponding to the erase potential (+6.5 V).

In FIG. 22, word line driving signal WL is indicated as a simple rectangular wave. However, this signal WL may be a positive/negative oscillation pulse as shown in FIG. 6C.

Figure 23:
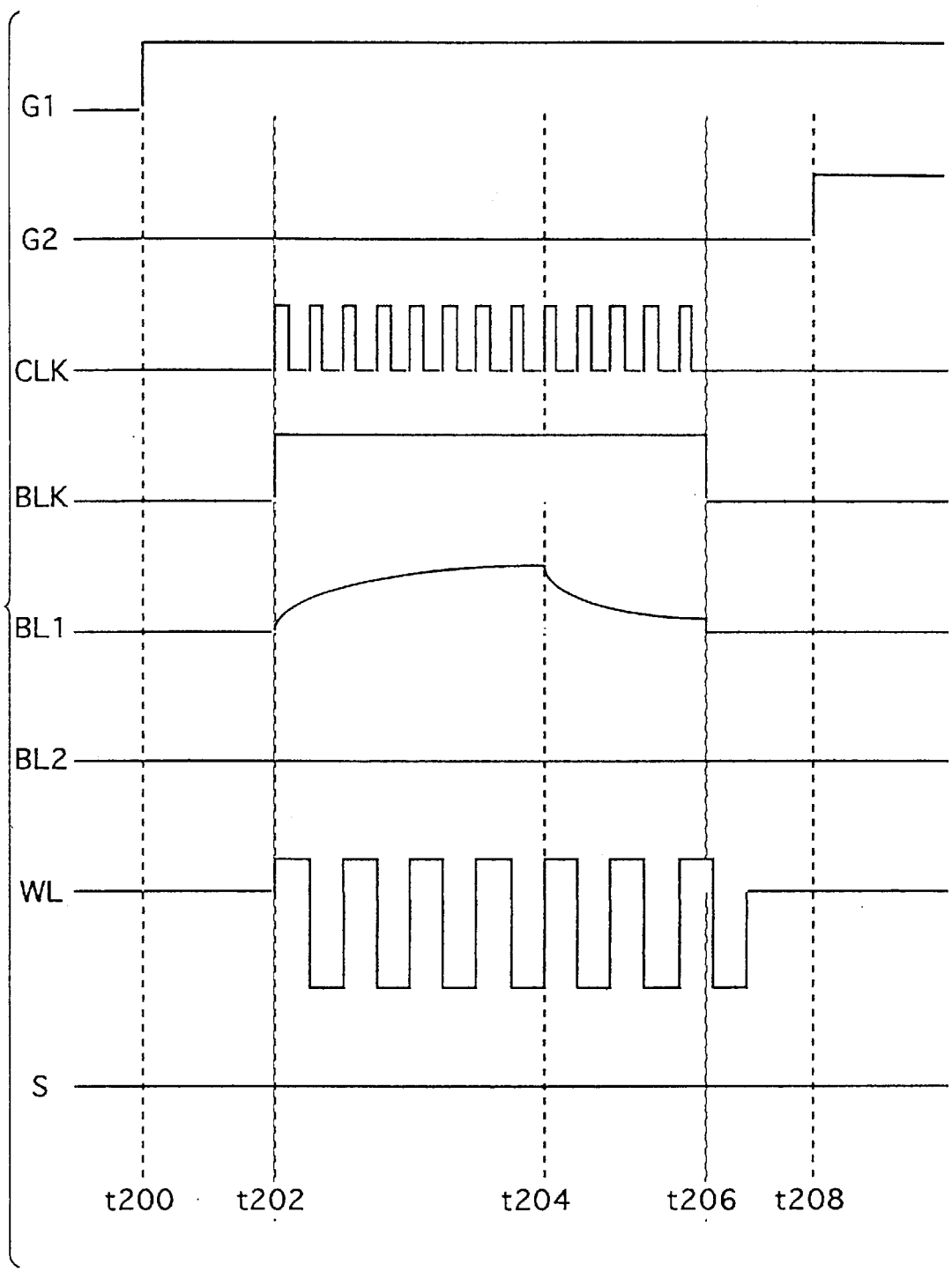
FIG. 23 is a timing chart for explaining a circuit operation (write operation) of the embodiment in FIG. 19.

FIG. 23 is a timing chart for explaining the circuit operation (write operation) of the embodiment shown in FIG. 19. When data is to be written in one (e.g., M11) of memory cell transistors M11 to M1m of the first column, data G1 of high level is written from memory rewrite circuit 110 in only memory 101 (time t200), and data G2, . . . of low level are written in the remaining memories 102 . . . . . Only transistor Tg1 is set in a weak ON state because of G1=H level, and the remaining transistors Tg2, . . . . are turned off.

When clock CLK is supplied to small current sources 201, 202, . . . . at time t202, these small current sources are enabled to supply small currents. When signal BLK goes to high level at time t202, and transistors Tb1, Tb2, . . . are turned on, small currents Is1, Is2, . . . can be supplied from small current sources 201, 202, . . . , to bit lines BL1, BL2, . . . , respectively. Since only data G1 is at high level, only transistor Tg1 is set in a weak ON state, and small current Is1 flows to this transistor. At this time, a write potential (write data) which is not practically influenced by a leakage current is generated in the drain of transistor Tg1. The write potential of bit line BL1 is maintained at the potential obtained in this manner.

From time t202, clock CLK for supplying a small current is supplied to small current source 201, and signal BLK goes to high level to supply small current Is1 to bit line BL1 (time t202 to time t206). In addition, positive/negative oscillation pulse-like word line driving signal WL is supplied to the gate of a specific memory cell transistor (e.g., M11) in which data is to be written (time t202 to time t206). During this period (time t202 to time t206), the potential of bit line BL1 gradually increases because of the supply of small current Is1 from small current source 201. When the write operation in the specific memory cell transistor (e.g., M11) is completed (time t204), this transistor (M11) is set in a weak ON state, and the potential of bit line BL1 is lowered (time t204 to time t206).

When the write operation in the specific memory cell transistor (M11) is completed, and data is to be further written in one (e.g., M22) of memory cell transistors M21 to M2m of the second column, only data G2 goes to high level. Thereafter, as in time t202 to t206, data is written in the next memory cell transistor (M22).

Since the small current (Is1) is supplied during the write period (time t202 to t206), the potential of the bit line (BL1) does not become too low, and a sufficient write level is ensured even when a leakage current flows, so that the data write operation can be properly completed.

FIG. 24 is a timing chart for explaining the circuit operation (read operation) of the embodiment shown in FIG. 19. In the read operation, all of data G1, G2, . . . are set at low level, and all of transistors Tg1, Tg2, . . . are turned off. Signal BLK is also set at low level, so that supply of small currents Is1, Is2, . . . to bit lines BL1, BL2, . . . is stopped.

When stored data is to be read out from, e.g., memory cell transistor M11, driving signal WL of word line W1 goes to high level (time t302 to time t304). At the same time, signal S goes to high level to connect bit line BL1 to sense amplifier SA1. With this operation, the potential of bit line BL1, which is determined on the basis of the content of the data stored in memory cell transistor M11, is detected by sense amplifier SA1, and data is read out from cell M11

During the read operation, signal BLK is set at low level such that no small current is supplied to any bit line, and all of data G1, G2, . . . are set at low level.

As described above, according to the nonvolatile semiconductor memory device of the present invention, after the bit line (sub-bit line) is precharged, a positive/negative oscillation pulse is applied to the floating gates of one or more addressed target memory cell transistors. With this operation, the different floating gate voltages of the large number of memory cell transistors can converge to a predetermined potential. For this reason, the write/erase operation in a lot of nonvolatile memory cells can be properly performed with a very simple operation. Since the potential of the sub-bit line is temporarily stored in an SRAM bit (e.g., 301) at a high speed, this sub-bit line potential is fixed at the stored potential, so that the potential variation is eliminated. In addition, the externally observed write speed is the same as the write speed in the SRAM bit. Furthermore, even when a leakage current flows to the bit line during the data write operation in a specific memory cell transistor while the SRAM bit is electrically disconnected from the bit line, the potential variation of the bit line can be suppressed by supplying a small current for compensating for the leakage current from a small current supply means (e.g., 201) to the bit line.

What is claimed is:

1. A nonvolatile semiconductor memory device comprising:
   a word line;
   a bit line;
   a memory cell block coupled to said word line and to said bit line, said memory cell block being arranged at an intersection position between said word line and said bit line;
   said memory cell block including a memory cell transistor, said memory cell transistor having a floating gate for holding nonvolatile information, and a control gate connected to said word line to control a write, erase, or read operation of the information held in said floating gate; and
   potential fixing means for temporarily storing a potential of said bit line, which is determined in correspondence with data to be stored in said memory cell transistor, and preventing a variation in potential of said bit line.

2. A nonvolatile semiconductor memory device according to claim 1, wherein said potential fixing means comprises storing means connected to said bit line for temporarily storing the data to be stored in said memory cell transistor.

3. A nonvolatile semiconductor memory device according to claim 2, wherein said storing means comprises a static memory.

4. A nonvolatile semiconductor memory device according to claim 3, wherein said static memory comprises a flip-flop circuit connected to said bit line through a connection transistor which is turned on at a predetermined timing.

5. A nonvolatile semiconductor memory device according to claim 3, wherein said static memory includes a connection transistor connected to said bit line to be turned on at a predetermined timing, a first transistor having a drain connected to said bit line through said connection transistor, and a second transistor having a gate connected to said bit line through said connection transistor and a drain connected to a gate of said first transistor.

6. A nonvolatile semiconductor memory device according to claim 5, wherein a conductance of said second transistor is set to be larger than a conductance of said first transistor, and said first transistor in a flip-flop circuit which is comprised of said first and second transistors is set in an OFF state before said connection transistor is turned on.

7. A nonvolatile semiconductor memory device according to claim 1, further comprising a main bit line, and bit line selection means for selectively connecting said main bit line to said bit line, and wherein said potential fixing means comprises a static memory, connected to said bit line, for temporarily storing the potential of said bit line, which is determined in correspondence with the data to be stored in said memory cell transistor, and said static memory includes a first connection transistor connected to said bit line to be turned on at a first predetermined timing, a second connection transistor connected to said bit line to be turned on at a second predetermined timing, a first transistor having a drain connected to said bit line through said first connection transistor and a gate connected to said bit line through said second connection transistor, and a second transistor having a drain connected to said bit line through said second connection transistor and a gate connected to said bit line through said first connection transistor.

8. A nonvolatile semiconductor memory device according to claim 7, wherein a conductance of said second transistor is set to be larger than a conductance of said first transistor, and said first transistor in a flip-flop circuit which is comprised of said first and second transistors is set in an OFF state before said first connection transistor is turned on.

* * * * *